(12) United States Patent
Takeda et al.

(10) Patent No.: US 12,437,962 B2
(45) Date of Patent: Oct. 7, 2025

(54) CHARGED PARTICLE BEAM APPARATUS

(71) Applicant: Hitachi High-Tech Corporation, Tokyo (JP)

(72) Inventors: Naoko Takeda, Tokyo (JP); Natsuki Tsuno, Tokyo (JP); Satoshi Takada, Tokyo (JP); Yuto Hattori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 383 days.

(21) Appl. No.: 18/029,004

(22) PCT Filed: Sep. 30, 2020

(86) PCT No.: PCT/JP2020/037168
§ 371 (c)(1),
(2) Date: Mar. 28, 2023

(87) PCT Pub. No.: WO2022/070311
PCT Pub. Date: Apr. 7, 2022

(65) Prior Publication Data
US 2023/0369012 A1    Nov. 16, 2023

(51) Int. Cl.
*H01J 37/22* (2006.01)
*H01J 37/20* (2006.01)
(Continued)

(52) U.S. Cl.
CPC ............ *H01J 37/222* (2013.01); *H01J 37/20* (2013.01); *H01J 37/244* (2013.01); *H01J 37/28* (2013.01)

(58) Field of Classification Search
USPC ........................................................ 250/310
See application file for complete search history.

(56) References Cited

U.S. PATENT DOCUMENTS

2002/0127484 A1* 9/2002 Nakasugi ............ H01J 37/3174
430/30
2008/0315093 A1  12/2008 Hasegawa et al.
(Continued)

FOREIGN PATENT DOCUMENTS

JP   2007-172886 A    7/2007
JP   2009-4114 A      1/2009
WO   WO 2020/115876 A1  6/2020

OTHER PUBLICATIONS

International Search Report (PCT/ISA/210) issued in PCT Application No. PCT/JP2020/037168 dated Nov. 24, 2020 with English translation (four (4) pages).

(Continued)

*Primary Examiner* — Kiet T Nguyen
(74) *Attorney, Agent, or Firm* — Crowell & Moring LLP

(57) ABSTRACT

Provided is a technique and the like capable of specifying irradiation areas or irradiation positions of a beam and a light as clearly as possible. A charged particle beam apparatus 1 includes: a position adjustment mark 10 provided on a stage 6 and irradiated with a beam b1 and a light a1; and a mechanism setting an irradiation position of the beam b1 and an irradiation position of the light a1 with respect to the stage 6 and changing a relative positional relationship including a distance between the irradiation position of the light a1 and the stage 6. A computer system 2 generates a first image in which the position adjustment mark 10 is reflected based on a first detection signal obtained by irradiating the position adjustment mark 10 with the beam b1, generates a second image in which an irradiation area of the light a1 is reflected in the vicinity of the position adjustment mark 10 based on a second detection signal obtained by irradiating the position adjustment mark 10 with the light a1, and adjusts an irradiation position of the beam b1 and an irradiation position of the light a1 based on the (Continued)

first image and the second image obtained when a positional relationship is changed by the mechanism.

13 Claims, 25 Drawing Sheets

(51) Int. Cl.
    *H01J 37/244*     (2006.01)
    *H01J 37/28*     (2006.01)

(56) References Cited

U.S. PATENT DOCUMENTS

2014/0322654 A1* 10/2014 Sentoku .............. G03F 7/2037
    430/296
2022/0013326 A1     1/2022 Takaguchi et al.

OTHER PUBLICATIONS

Japanese-language Written Opinion (PCT/ISA/237) issued in PCT Application No. PCT/JP2020/037168 dated Nov. 24, 2020 (three (3) pages).

* cited by examiner

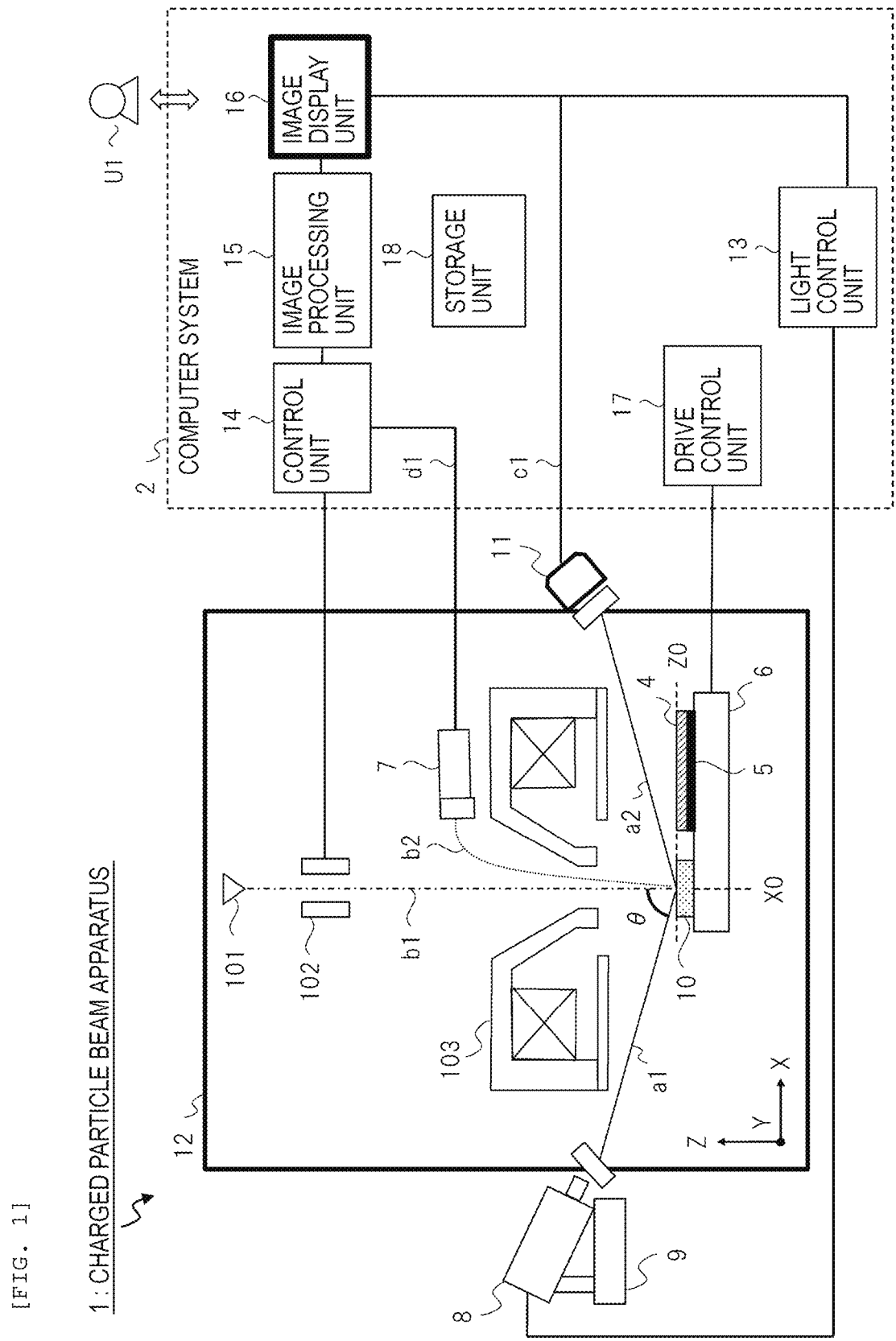
[FIG. 1]

[FIG. 2]
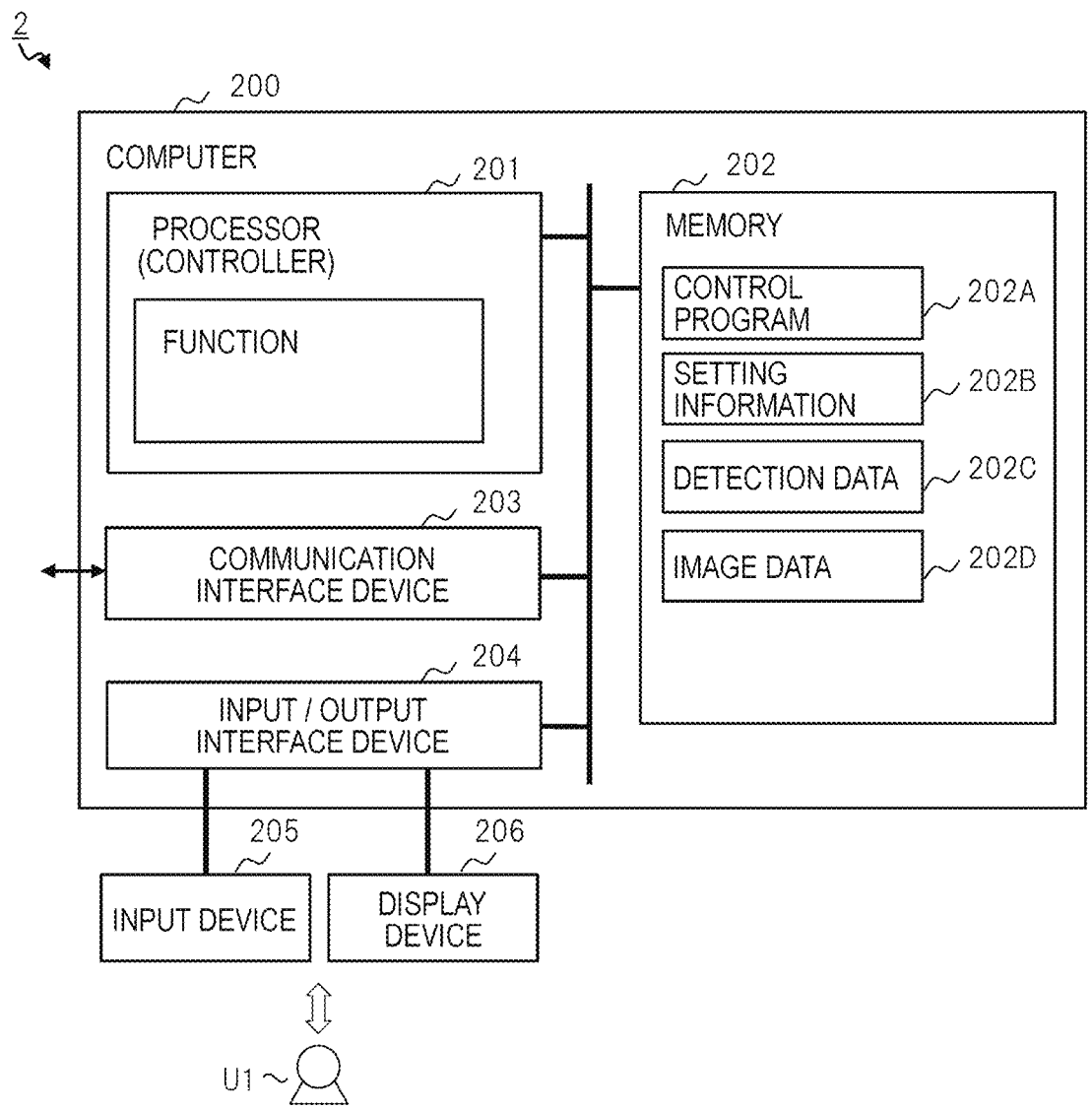

SECONDARY ELECTRON IMAGE (LOW MAGNIFICATION)

PHOTODETECTOR IMAGE

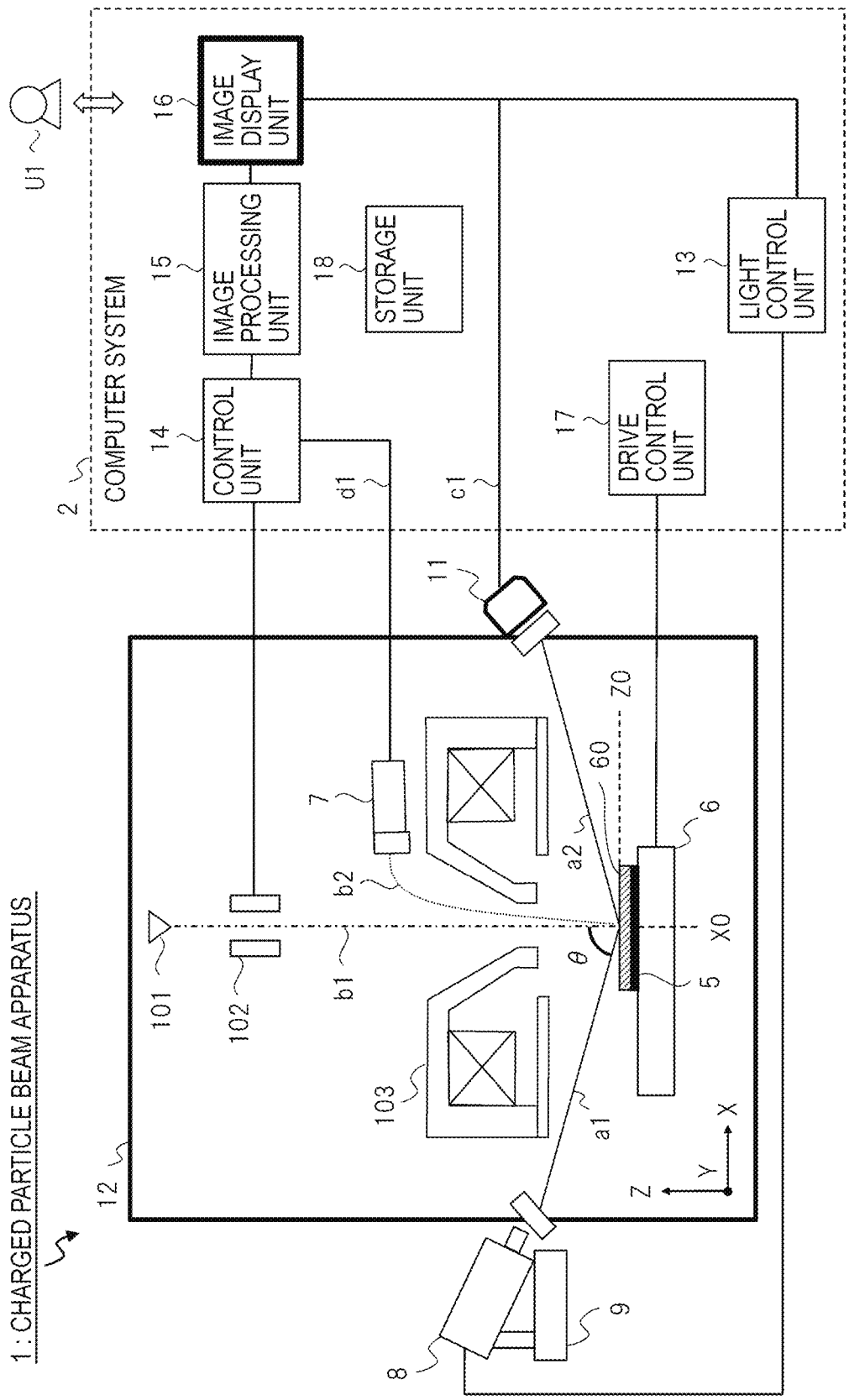

[FIG. 7]
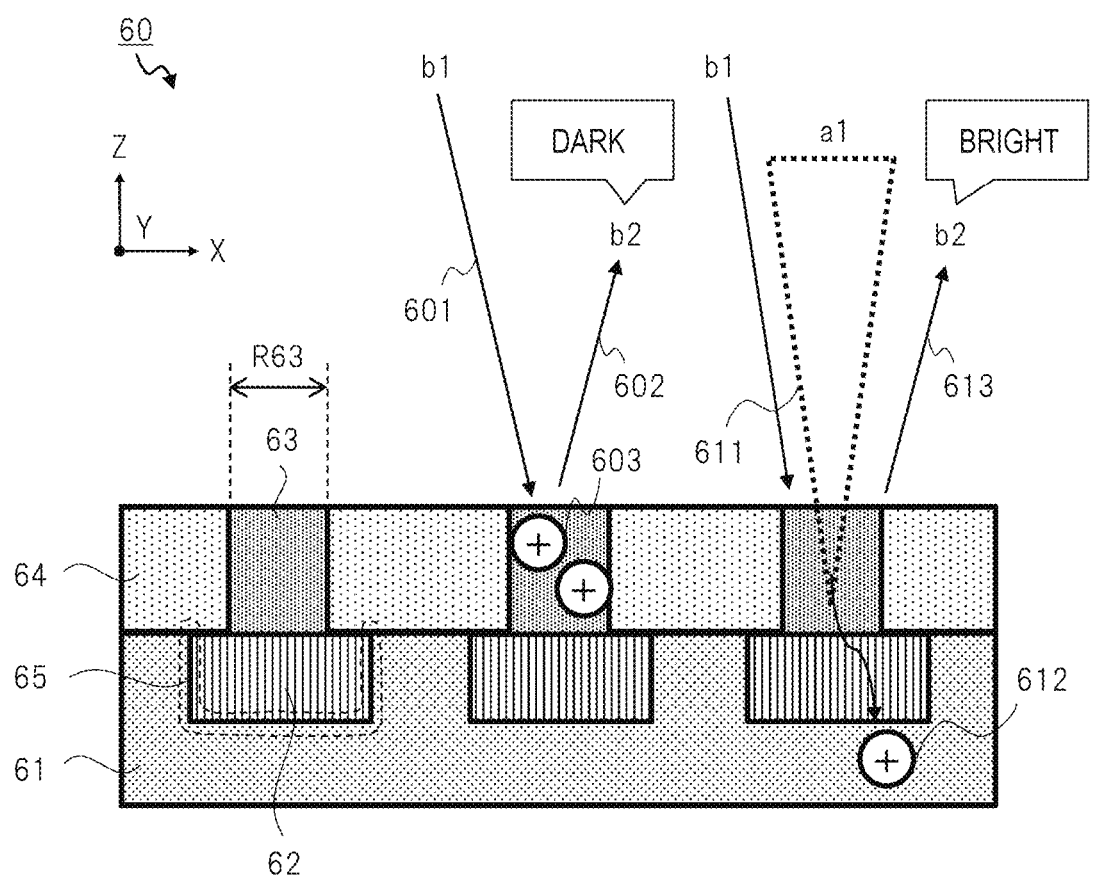

FIG. 8A  SECONDARY ELECTRON IMAGE
(DURING IRRADIATION WITH BEAM b1 AND LIGHT a1)
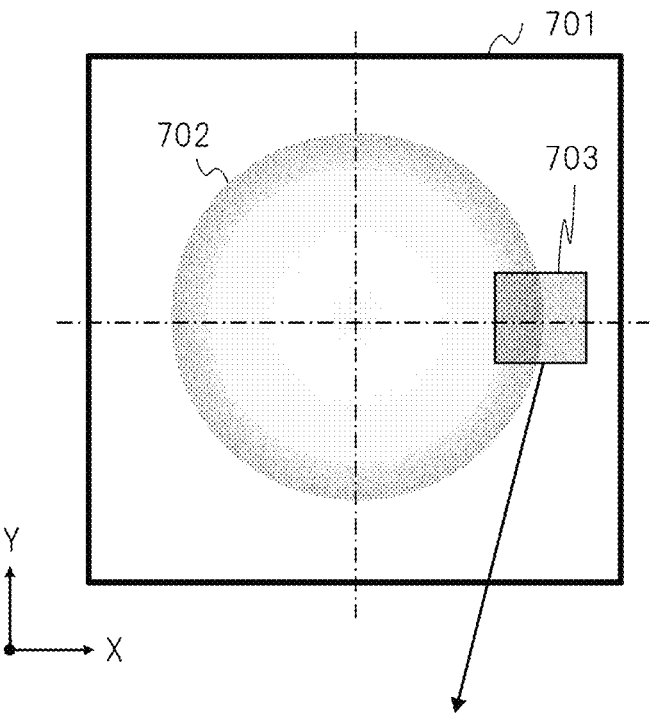
FIG. 8B  ENLARGED VIEW
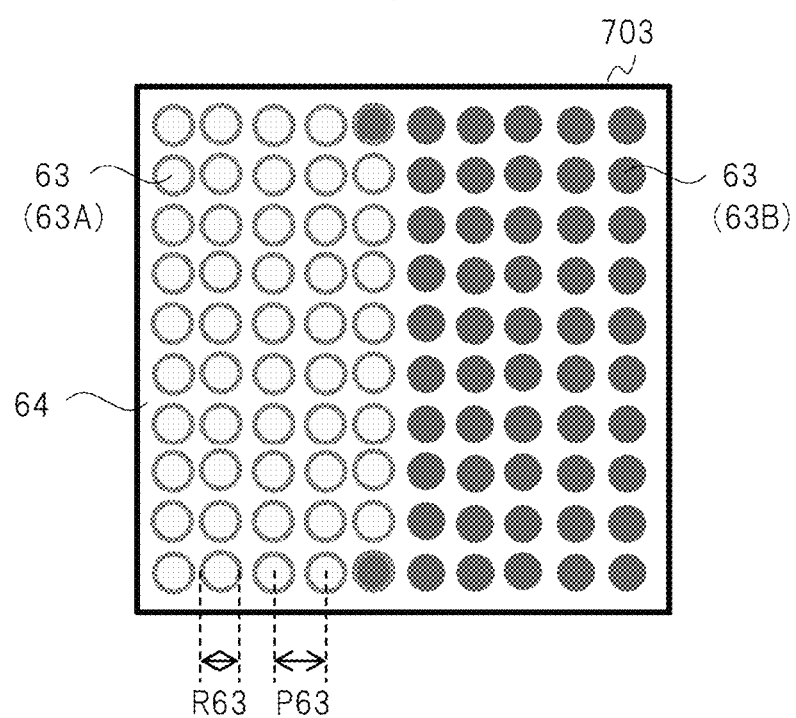

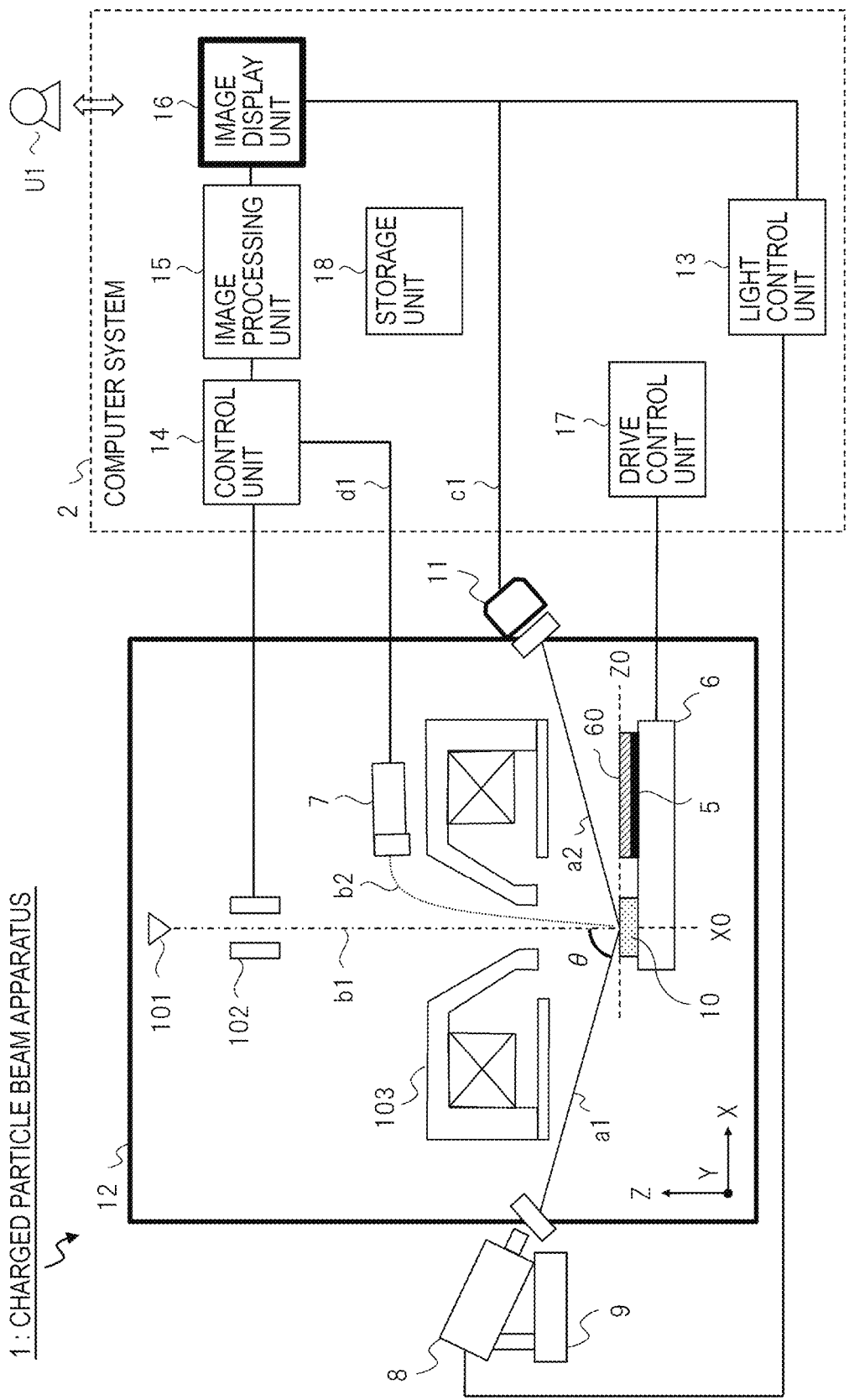

[FIG. 10]
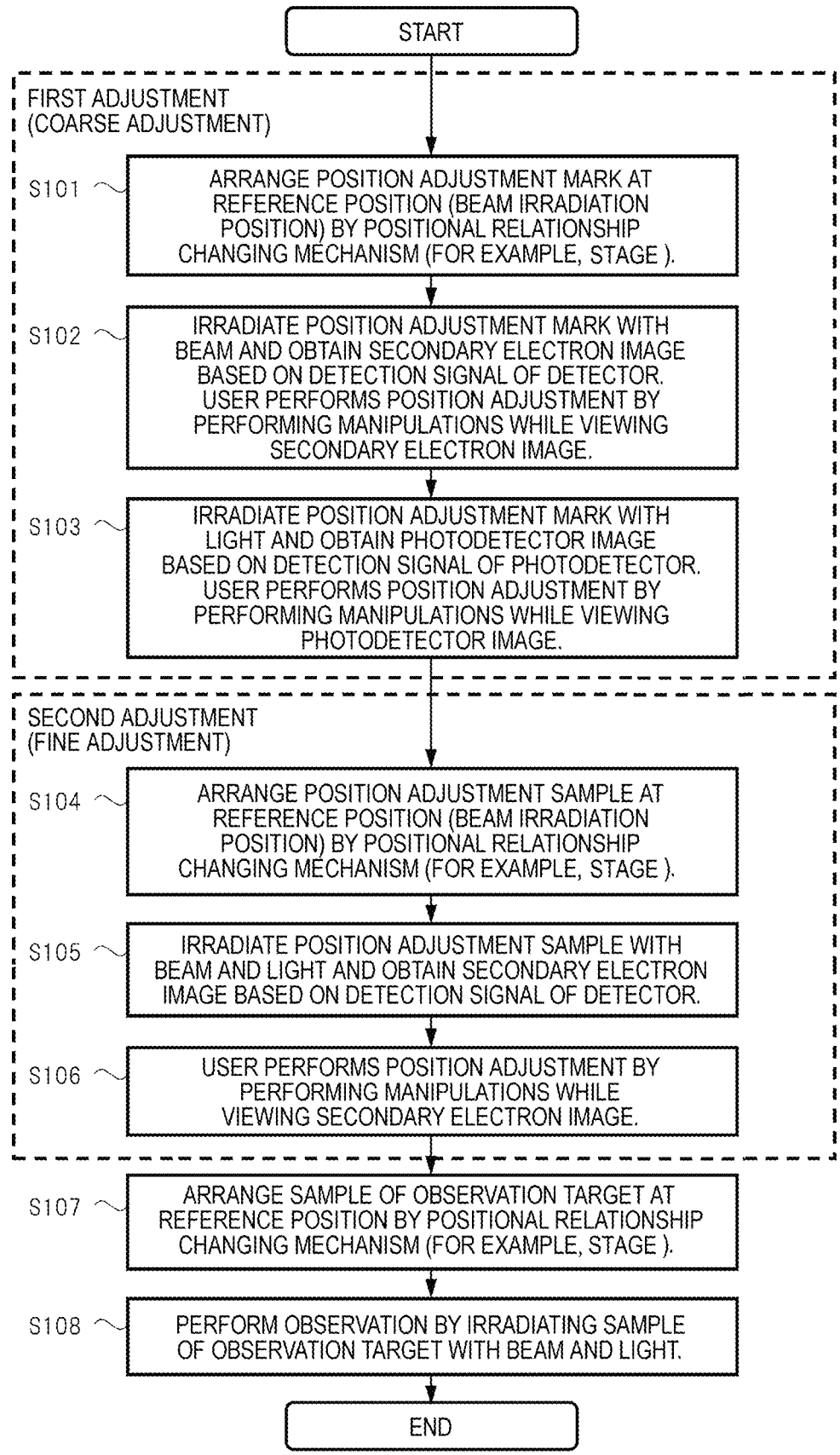

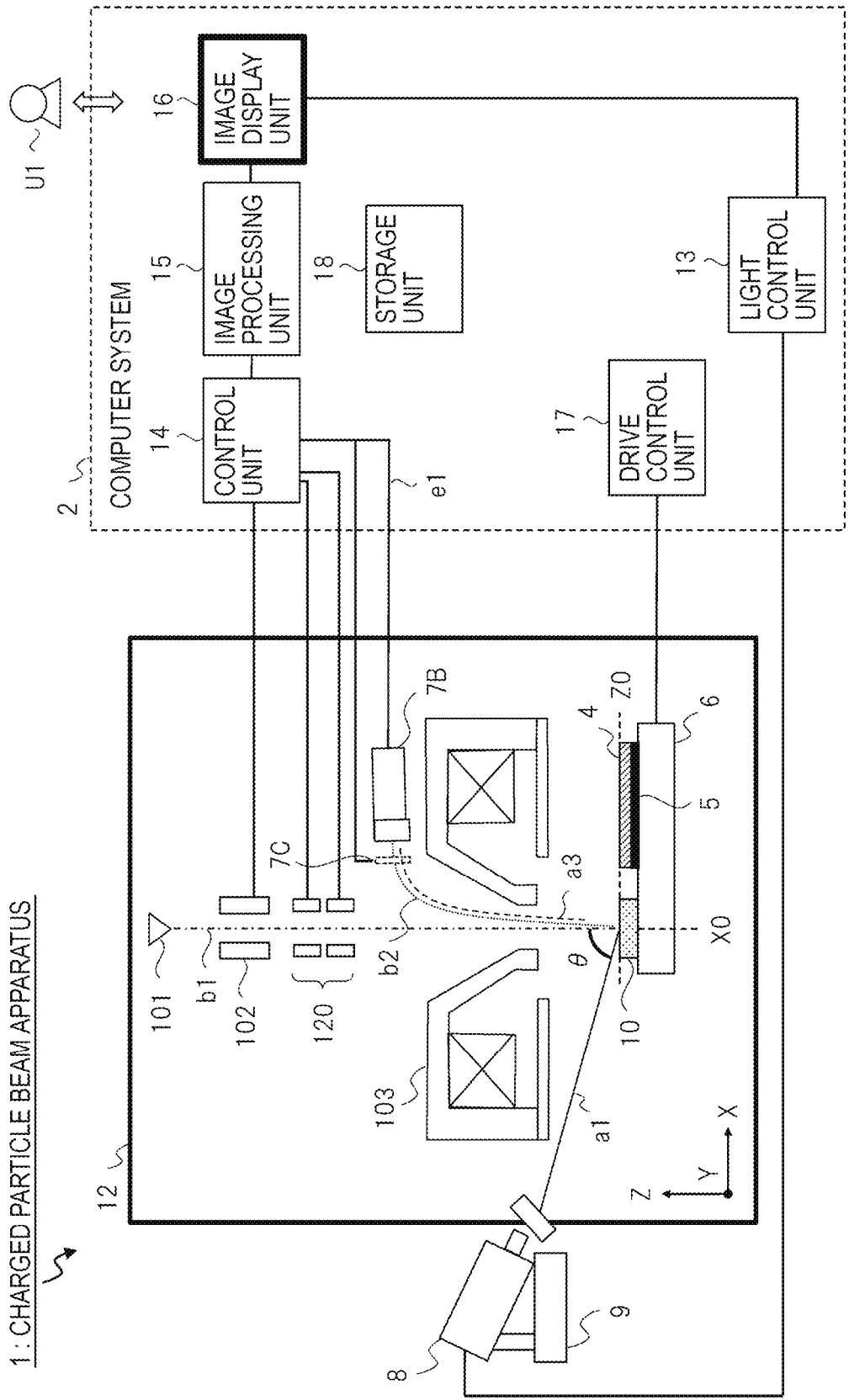
[FIG. 11]

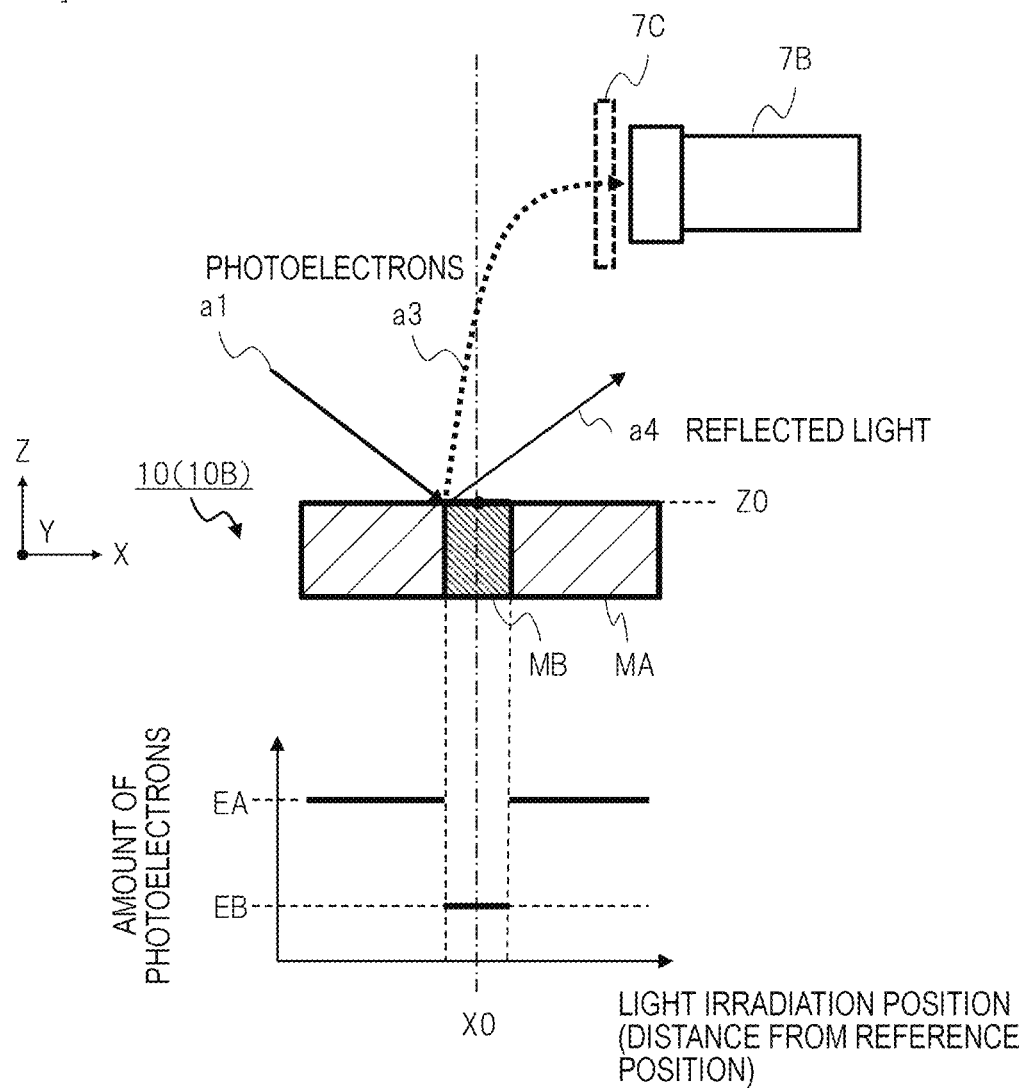
[FIG. 13]

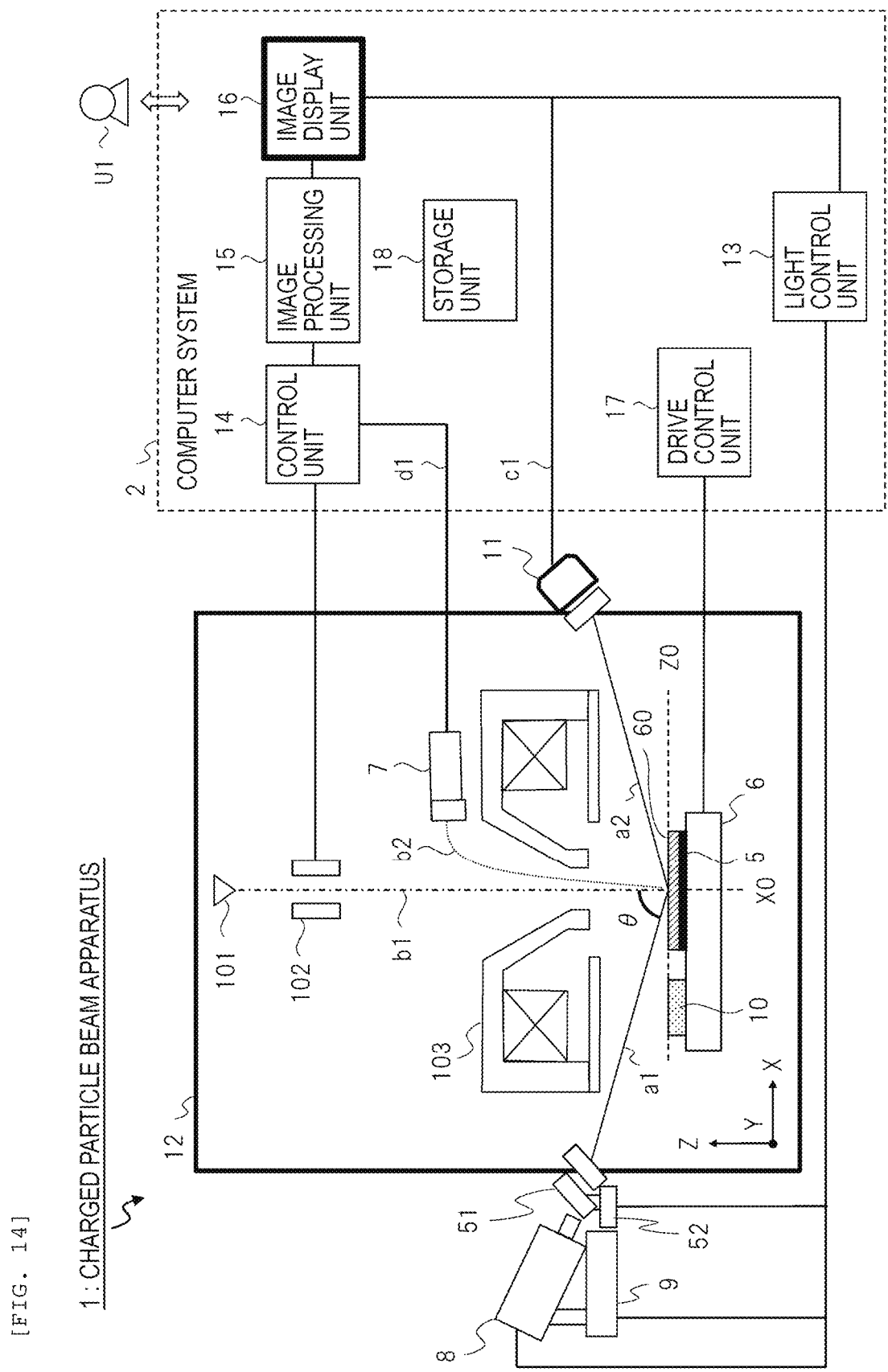

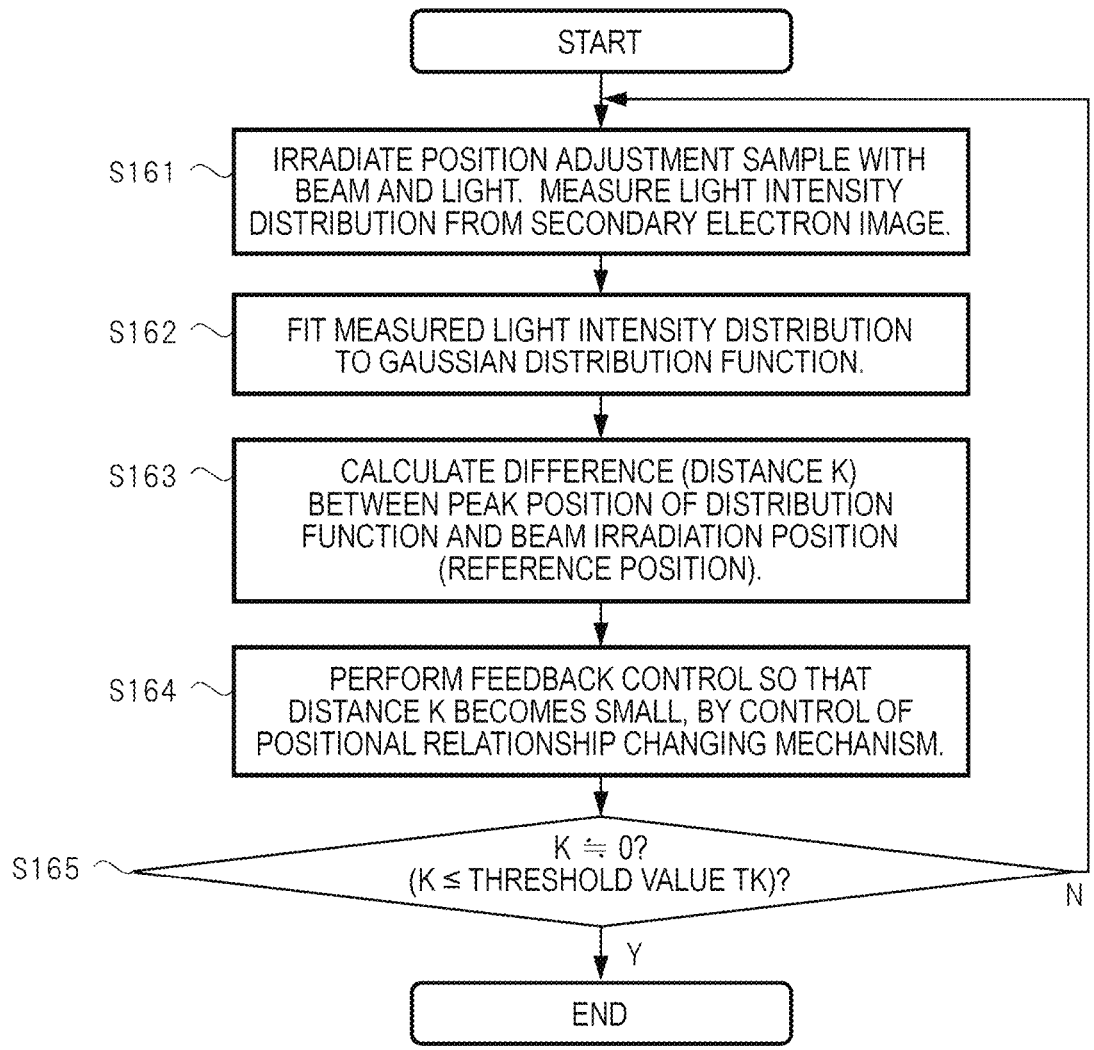
[FIG. 16]

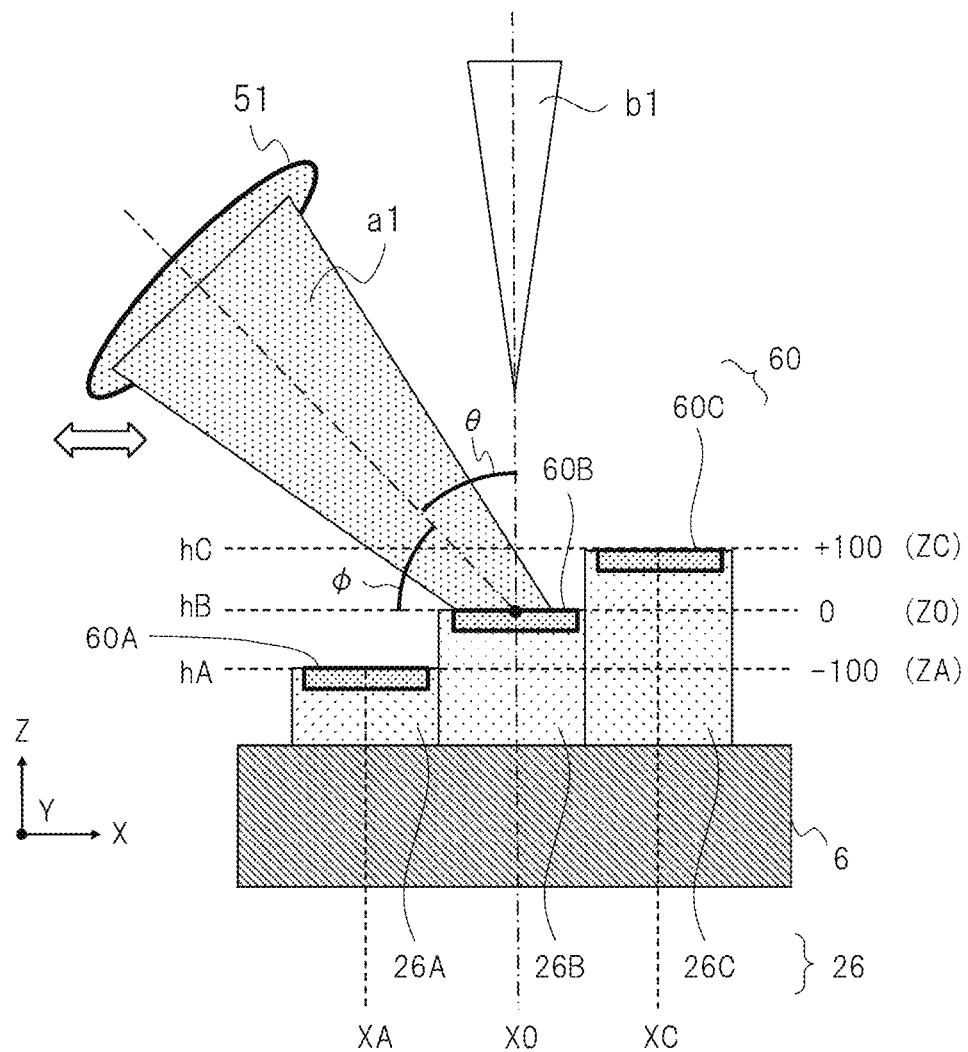
[FIG. 18]

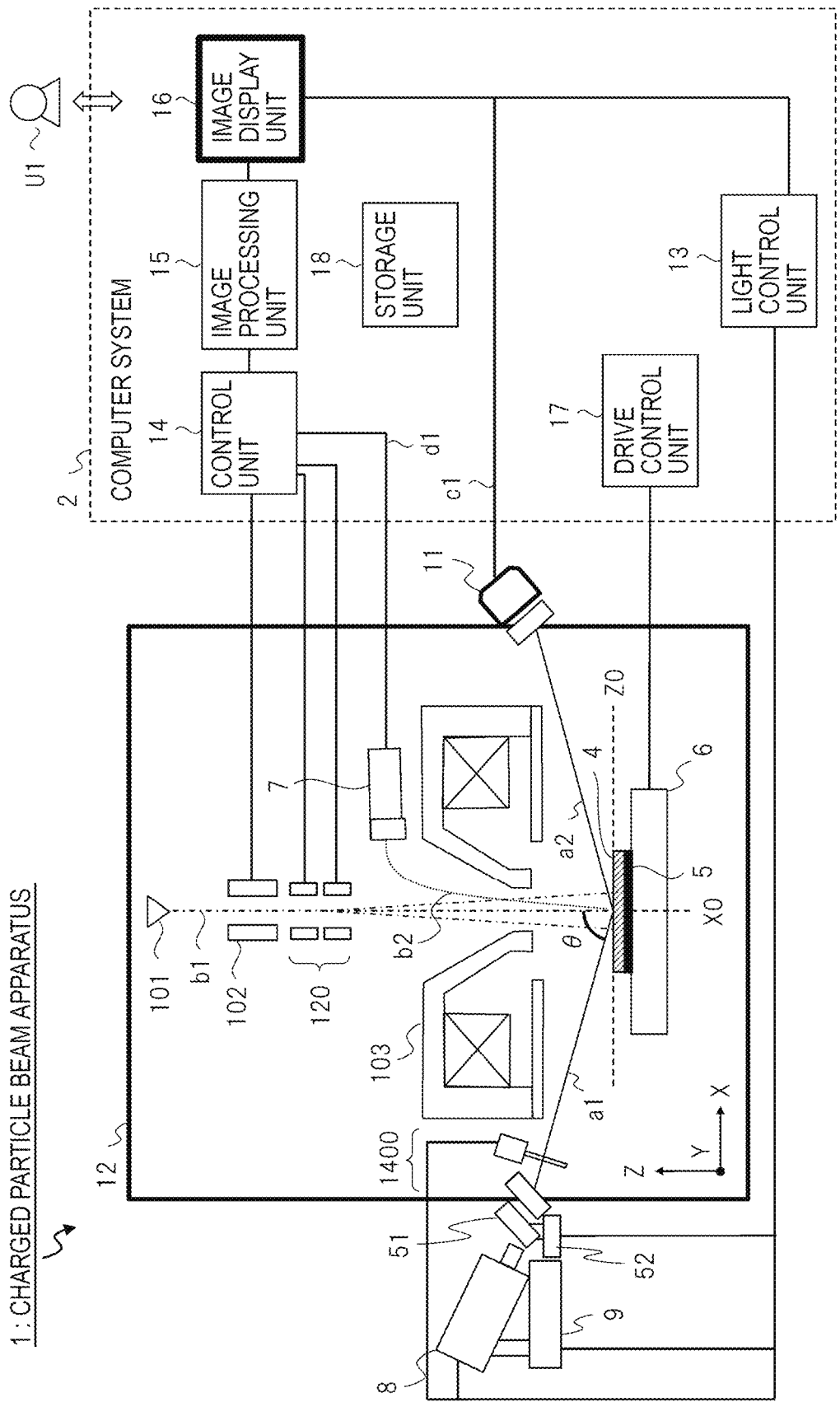

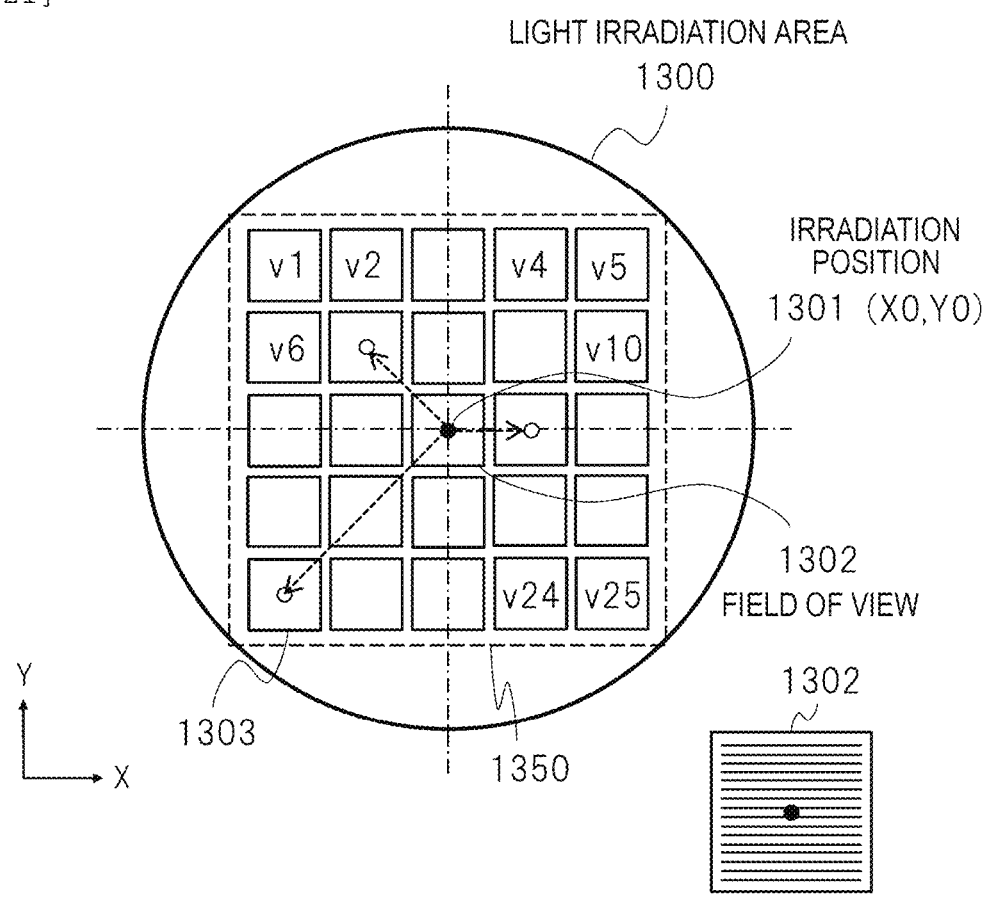
[FIG. 21]

FIG. 23A
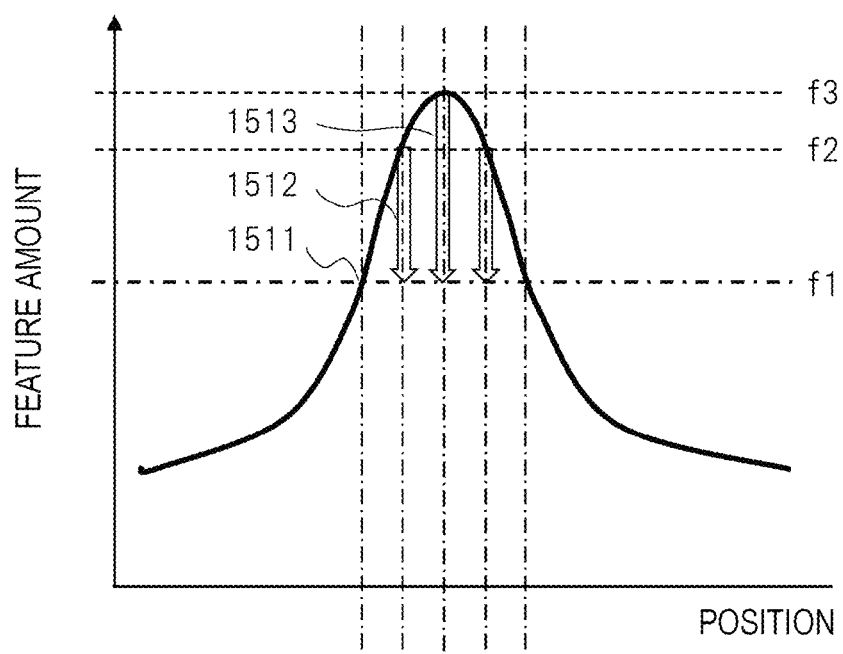
FIG. 23B
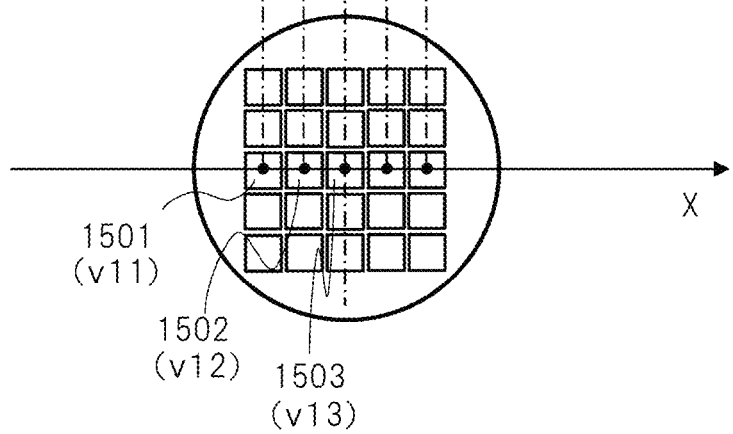
FIG. 23C
| FIELD-OF-VIEW POSITION | FILTER TYPE |
|---|---|
| ... | ... |
| v11 | 0 |
| v12 | F1 |
| v13 | F2 |
| ... | ... |

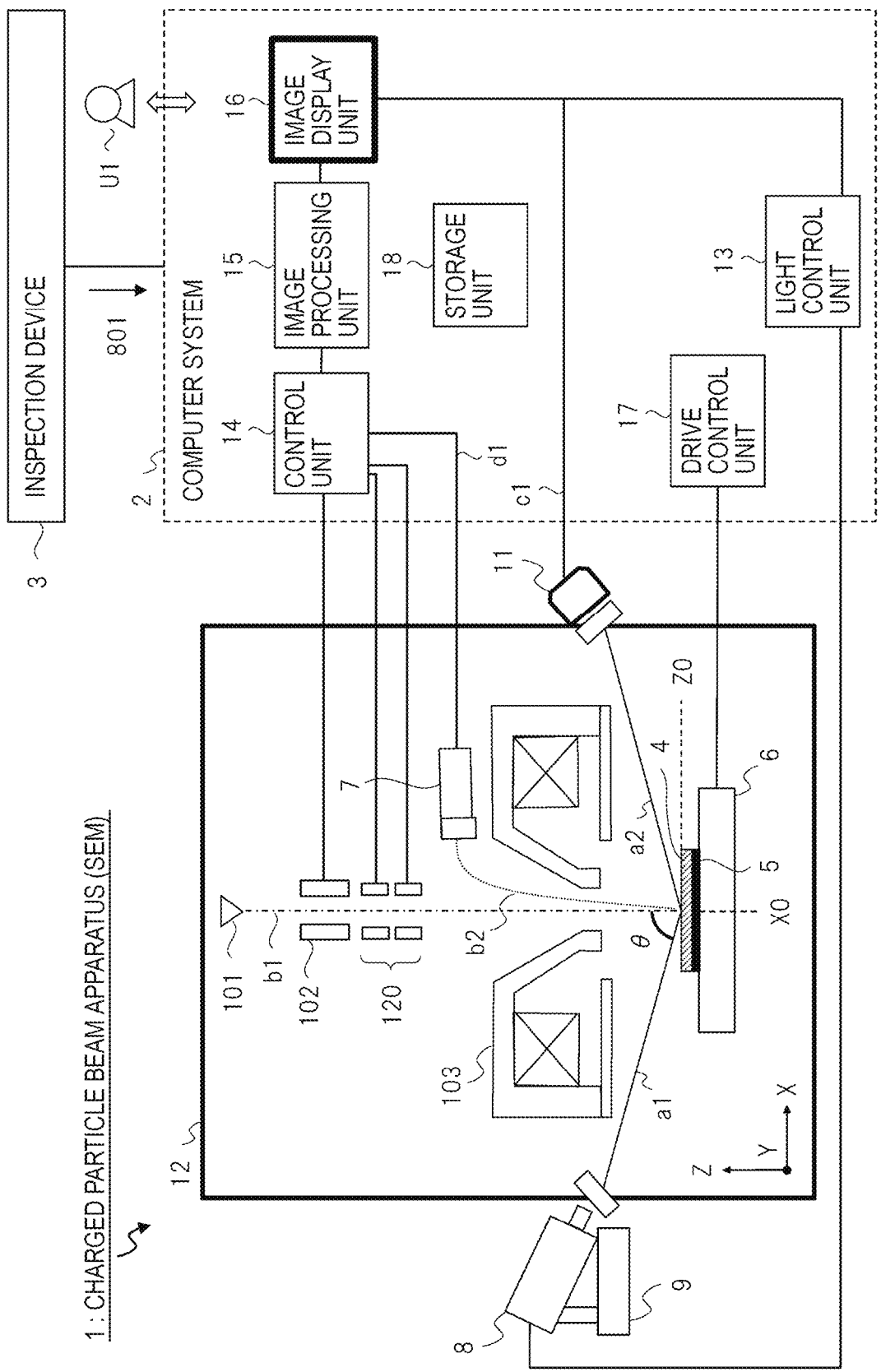

[FIG. 25]
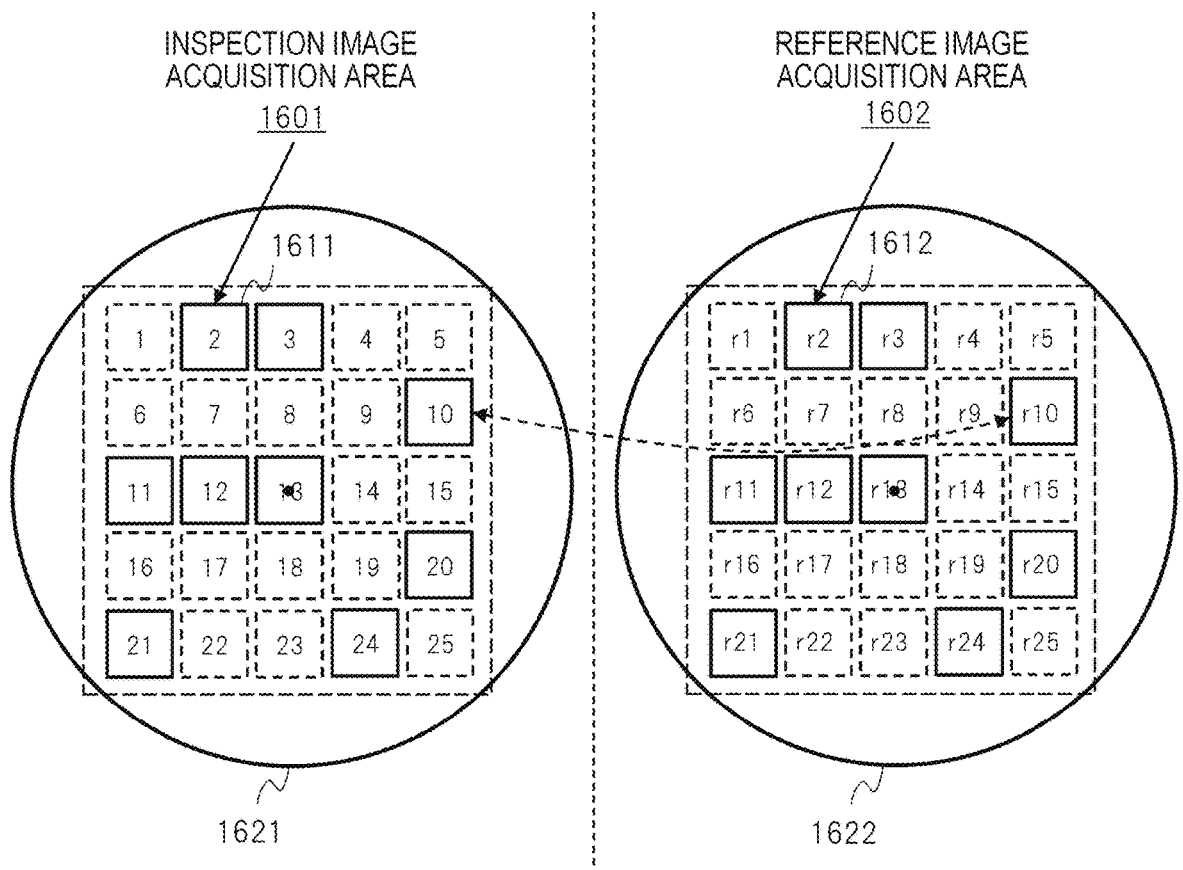

CHARGED PARTICLE BEAM APPARATUS

TECHNICAL FIELD

The present invention relates to a technique of a charged particle beam apparatus.

BACKGROUND ART

As charged particle beam apparatuses, there are electron microscopes and ion microscopes. As microscopes, there are a scanning electron microscope (SEM) and the like. A charged particle beam apparatus is known to cause variations in brightness and distortion of a secondary charged particle image due to charging of a sample during processing such as observation and analysis of the sample. On the other hand, as a charging suppressing technique, there is a technique of irradiating an irradiation area of a primary charged particle beam with an electromagnetic wave such as a light.

As a background art in this technical field, there is disclosed in WO2020/115876A (PTL 1). In PTL 1, a technique is disclosed where "a charged particle beam apparatus according to the present invention determines whether or not an irradiation position of the primary charged particle beam and an irradiation position of the light match with each other based on a difference between a first observation image acquired during irradiation with only a primary charged particle beam and a second observation image acquired during irradiation with a light in addition to the primary charged particle beam. In addition, it is determined whether or not the irradiation position of the primary charged particle beam and the irradiation position of the light match with each other by using the first observation image and a result of measurement by a light amount measuring device".

CITATION LIST

Patent Literature

PTL 1: WO2020/115876A

SUMMARY OF INVENTION

Technical Problem

In a charged particle beam apparatus having a function of irradiating a sample with a primary charged particle beam (hereinafter, sometimes referred to as a beam) and an electromagnetic wave (hereinafter, sometimes referred to as a light) such as a light, an irradiation area or an irradiation position of the light needs to be specified as clearly as possible. When the irradiation position of the beam and the irradiation position of the light on the sample are misaligned, there is a possibility of causing a bad effect. For example, when the purpose is to suppress charging by the light irradiation, in a case where there is a shift in the irradiation positions, there is a possibility that an area where charging is not removed remains. In addition, for example, when evaluating electrical characteristics from a potential contrast image based on secondary electrons, there is a possibility that defects in electrical characteristics cannot be detected.

In addition, in the related art, the light irradiation area and the beam irradiation position can be substantially aligned with each other based on the user manipulation or the like. However, in some cases, a distribution of aberration components and intensity of the light irradiated onto a sample surface of an inspection target may be non-uniform. For this reason, the non-uniformity affects excitation of a secondary electron observation signal of the inspection target. As a result, in some cases, instability (such as distortion of brightness) may occur in a luminance distribution in the image of the secondary electron observation signal.

In the above-described charged particle beam apparatus, when evaluating electrical properties and material properties of the sample from a secondary electron image such as a grayscale image obtained by irradiating the sample with both the beam and the light, it is preferable to stabilize luminance of the secondary electron image. In order to stabilize a light intensity of the secondary electron observation signal and the luminance of the corresponding secondary electron image, it is preferable that the irradiation position of the beam and the irradiation position of the light, particularly, a center position of a light intensity distribution are aligned with each other with high accuracy.

An object of the present disclosure is, with respect to the technique of the charged particle beam apparatus, to provide a technique capable of specifying irradiation areas or irradiation positions of a beam and a light as clearly as possible, particularly a technique capable of aligning the irradiation position of the beam and the irradiation position of the light, particularly a center position of a light intensity distribution with high accuracy. Other problems and effects of the present disclosure are described in "Description of Embodiments".

Solution to Problem

A representative embodiment of the present disclosure has the following configuration. According to an embodiment, there is provided a charged particle beam apparatus including: a charged particle source generating a charged particle beam with which a sample is irradiated; a light source generating a light with which the sample is irradiated; a first detector detecting secondary charged particles obtained by irradiating the sample with the charged particle beam; a stage on which the sample is mounted; a position adjustment mark provided on the stage and irradiated with the charged particle beam and the light; a second detector detecting a secondary light obtained by irradiating the position adjustment mark with the light; a computer system controlling irradiation with the charged particle beam and irradiation with the light, acquiring a first detection signal by the first detector and a second detection signal by the second detector, and generating and displaying an image; and a mechanism setting an irradiation position of the charged particle beam and an irradiation position of the light with respect to the stage and changing a relative positional relationship including a distance between the irradiation position of the light and the stage, under control of the computer system, in which the computer system: generates a first image in which the position adjustment mark is reflected based on the first detection signal obtained by irradiating the position adjustment mark with the charged particle beam; generates a second image in which an irradiation area of the light is reflected in the vicinity of the position adjustment mark based on the second detection signal obtained by irradiating the position adjustment mark with the light; and adjusts the irradiation position of the charged particle beam and the irradiation position of the light based on the first image and the second image obtained when the positional relationship is changed by the mechanism.

Advantageous Effects of Invention

According to the representative embodiments of the present disclosure, with respect to the technique of the charged particle beam apparatus, the irradiation areas or the irradiation positions of the beam and the light can be specified as clearly as possible, particularly, the irradiation position of the beam and the irradiation position of the light, particularly, the center position of the light intensity distribution can be aligned with each other with high accuracy.

BRIEF DESCRIPTION OF DRAWINGS

FIG. 1 illustrates a configuration of a charged particle beam apparatus according to a first embodiment of the present disclosure.

FIG. 2 illustrates a configuration example of a computer system in the first embodiment.

FIG. 6 illustrates a configuration of a charged particle beam apparatus according to a second embodiment of the present disclosure.

FIG. 7 illustrates a configuration example of a position adjustment sample in the second embodiment.

FIGS. 8A and 8B illustrate an example of adjustment using the position adjustment sample in the second embodiment.

FIG. 9 illustrates a configuration of a charged particle beam apparatus according to a third embodiment of the present disclosure.

FIG. 10 illustrates a processing flow in the third embodiment.

FIG. 11 illustrates a configuration of a charged particle beam apparatus according to a fourth embodiment of the present disclosure.

FIG. 13 illustrates a change in luminance according to a light irradiation position in the fourth embodiment.

FIG. 14 illustrates a configuration of a charged particle beam apparatus according to a fifth embodiment of the present disclosure.

FIG. 16 illustrates a processing flow for the automatic adjustment in the fifth embodiment.

FIG. 18 illustrates a configuration example of a stub and a position adjustment sample in a charged particle beam apparatus according to a sixth embodiment of the present disclosure.

FIG. 20 illustrates a configuration of a charged particle beam apparatus according to a seventh embodiment of the present disclosure.

FIG. 21 illustrates movement of a field of view in the seventh embodiment.

FIGS. 23A to 23C illustrate correction of a light intensity according to a field-of-view position in the seventh embodiment.

FIG. 24 illustrates the configuration of a charged particle beam apparatus according to an eighth embodiment of the present disclosure.

FIG. 25 illustrates comparison between an inspection image and a reference image in the eighth embodiment.

DESCRIPTION OF EMBODIMENTS

Figure 3A:
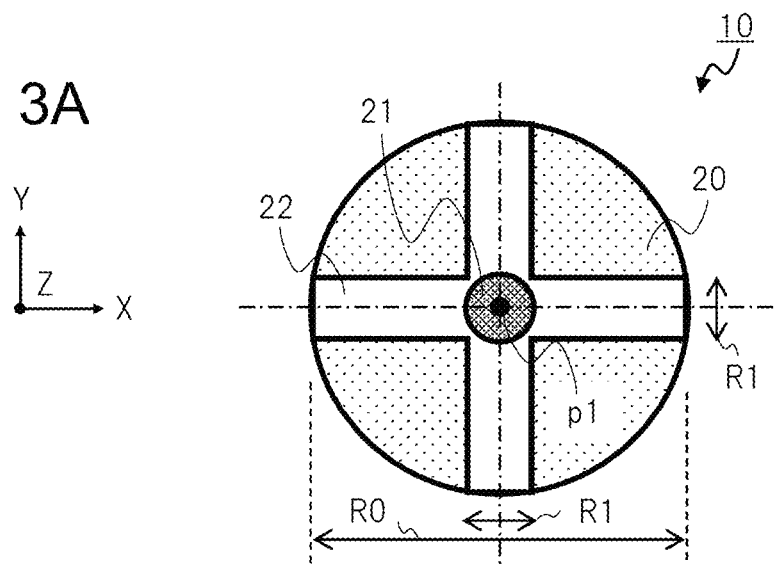
FIGS. 3A and 3B illustrate a configuration example of a position adjustment mark in the first embodiment.

Hereinafter, embodiments will be described in detail with reference to the drawings. In the drawings, in principle, the same components are denoted by the same reference numerals, and redundant description is omitted. In the drawings, in order to facilitate understanding the representation of each component, the actual position, size, shape, range, and the like may not be represented. For the sake of explanation, when describing processing by a program, there are cases where the program, functions, processing units, and the like are mainly explained, but the main bodies as hardware for the program, functions, processing units, and the like are a processor or controllers, devices, computers, systems, and the like configured with the processor and the like. A computer executes processing according to a program read from a memory by a processor while appropriately using resources such as a memory and a communication interface. Accordingly, predetermined functions, processing units, and the like are realized. The processor is configured with, for example, a semiconductor device or the like such as a CPU or a GPU. The processor is configured with devices and circuits capable of performing predetermined arithmetic operations. The processing is not limited to software program processing and can be implemented also in a dedicated circuit. FPGA, ASIC, or the like can be applied to the dedicated circuit. The program may be installed as data in a target computer in advance, or may be distributed and installed to the target computer as data from the program source. The program source may be a program distribution server on a communication network or may be a non-transitory computer-readable storage medium. The program may be configured with a plurality of program modules.

First Embodiment

A charged particle beam apparatus according to a first embodiment of the present disclosure will be described with reference to FIGS. 1 to 5. A charged particle beam apparatus 1 according to the first embodiment illustrated in FIG. 1 and the like has a function of irradiating a sample 4 or the like with both a beam b1 and a light a1. This function is a function that can irradiate the sample 4 or the like with only the beam b1, with only the light a1, or with both the beam b1 and the light a1 at the same time under the control. On the assumption of this function, the charged particle beam apparatus 1 according to the first embodiment has a function (referred to as an adjustment function or the like) of matching the irradiation position of the beam b1 and the irradiation position of the light a1. This charged particle beam apparatus 1 has a position adjustment mark 10 which is a mark or a marker arranged on a stage 6 for this position adjustment. The charged particle beam apparatus 1 irradiates the position adjustment mark 10 on the stage 6 with both the beam b1 and the light a1 to obtain a detection signal d1 based on a manipulation of a user U1 while viewing an image. Then, the charged particle beam apparatus 1 adjusts alignment between the irradiation position of the beam b1 and the irradiation position of the light a1 based on the detection signal d1.

[1-1. Overview]

The charged particle beam apparatus 1 according to the first embodiment includes a charged particle source generating the beam b1 with which the sample 4 is irradiated, a light source 8 generating the light a1 with which the sample 4 is irradiated, a first detector which is a detector 7 detecting secondary charged particles b2 such as secondary electrons obtained by irradiating the sample 4 with the beam b1, a stage 6 on which the sample 4 is mounted, a position adjustment mark 10 provided in the stage 6 and irradiated with the light a1 and the beam b1, and a second detector which is a photodetector 11 detecting a light a2 as a secondary light obtained by irradiating the position adjustment mark 10 with the light a1. In addition, the charged particle beam apparatus 1 according to the first embodiment includes a mechanism (referred to as a positional relationship changing mechanism) capable of changing a relative positional relationship including the distance between the irradiation position of the light a1 and the position of the stage 6 (or an object on the stage 6). This mechanism includes, for example, a drive control mechanism for the light source 8 and a drive control mechanism for the stage 6. In addition, the charged particle beam apparatus 1 according to the first embodiment includes a computer system 2 that controls the irradiation with the beam b1 and the light a1 and generates and displays an image based on a first detection signal detected by the first detector when the sample 4 is irradiated with the light a1 and irradiated with the beam b1. The computer system 2 is a controller of the charged particle beam apparatus 1.

Then, the computer system 2 generates an image in which the position adjustment mark 10 is reflected based on the first detection signal obtained when the position adjustment mark 10 is irradiated with the beam b1. The computer system 2 obtains a second detection signal from the second detector when the positional relationship between the irradiation position of the light a1 and the stage 6 is controlled and changed. The computer system 2 adjusts the irradiation position of the beam b1 and the irradiation position of the light a1 so as to be aligned with each other based on the image of the position adjustment mark 10 and the second detection signal. The computer system 2 displays the image of the position adjustment mark 10 and the second detection signal to the user U1 as an image and adjusts the irradiation position of the beam b1 and the irradiation position of the light a1 so as to be aligned with each other based on the manipulation of the user U1 while viewing the image. The user U1 can easily perform alignment between the irradiation position of the beam b1 and the irradiation position of the light a1 by performing manipulations while viewing the image.

[1-2. Charged Particle Beam Apparatus]

FIG. 1 illustrates a configuration of the charged particle beam apparatus 1 according to the first embodiment. The charged particle beam apparatus 1 is mainly divided into the mechanism including a vacuum chamber 12 and the computer system 2 connected thereto. The charged particle beam apparatus 1 includes an electron optical system, a light irradiation system, and an image generation system. The electron optical system is configured with an electron source 101, a polarizer 102, an electron lens 103, the sample 4, a sample holder 5, the stage 6, the detector 7, and the like, which are arranged in the vacuum chamber 12. The detector 7 is a secondary electron detector and is also referred to as a first detector for distinction.

The light irradiation system includes the light source 8, a light source adjustment stage 9, the position adjustment mark 10, the photodetector 11, a light control unit 13, and the like. The photodetector 11 is also referred to as a second detector for distinction. The image generation system is configured with a control unit 14, an image processing unit 15, an image display unit 16, and the like.

The computer system 2 includes a control unit 14, an image processing unit 15, an image display unit 16, a light control unit 13, a drive control unit 17, a storage unit 18, and the like. The control unit 14 is a portion that mainly controls the electron optical system and acquires the detection signal d1 (also referred to as a first detection signal for distinction) from the detector 7. The light control unit 13 is a portion that mainly controls the light irradiation system and acquires a detection signal c1 (also referred to as a second detection signal for distinction) from the photodetector 11. The detection signal c1 is a signal obtained by detecting the light a2, which is a secondary light based on the irradiation with the light a1 and a signal having a light intensity distribution. The detection signal d1 is a signal obtained by detecting secondary charged particles b2 such as secondary electrons in the irradiation with the only beam b1, or a signal obtained by detecting the secondary charged particles b2 in the irradiation with both the beam b1 and the light a1.

The drive control unit 17 is a component driving and controlling mechanisms such as a stage 6. In the first embodiment, the computer system 2 controls the drive control unit 17 and the light control unit 13 to change the relative positional relationship including the distance between the irradiation position of the light a1 and the position of the stage 6 (or the object on the stage 6). The control of the position of the stage 6 includes control of movement at least in illustrated X and Y directions and may also control movement in a Z direction. Although the description is omitted due to a known technique, the charged particle beam apparatus 1 can convey the sample 4 into the vacuum chamber 12, arrange the sample 4 on the stage 6, and control the evacuation of the vacuum chamber 12.

In terms of the description, the directions and the coordinate system have the X, Y, and Z directions illustrated. The X and Y directions are two perpendicular directions constituting a horizontal plane associated with an upper surface of the stage 6, in other words, radial directions when the stage 6 is circular or the like. The Z direction is a vertical direction perpendicular to the X and Y directions, in other words, a height direction.

The sample 4 is a sample such as a wafer that is an observation target. The sample 4 is mounted on and held by the sample holder 5 on the stage 6. It is noted that FIG. 1 illustrates a state of the sample 4 during the irradiation of the position adjustment mark 10 described later rather than during the observation of the sample 4. At this time, in the X direction, the position X0 indicates the irradiation position of the beam b1 or the light a1 with respect to the surface (the position Z0 as a reference position in the height direction) of the position adjustment mark 10. After the position alignment, the sample 4 can be arranged at this position X0 by controlling the stage 6 and the like during the normal observation of the sample 4. Although the description is omitted, the position movement and adjustment can be performed in the Y direction as well. In this example, the position Z0 is used as the reference position in the Z direction. The position Z0 is a position corresponding to the surface of the sample 4 on the stage 6. The surface of the position adjustment mark 10 is also arranged so as to be aligned with this position Z0. The reference position in the height direction can be set without being limited to the position Z0, and for example, the upper surface of the stage 6 may be set as the reference position.

When observing the sample 4, the computer system 2 drives and controls the electron optical system and the like from the control unit 14. The control unit 14 applies the control signal to each component of the electron optical system. Based on this, the beam b1, which is a primary charged particle beam emitted from the electron source 101 which is a charged particle source, is polarized by the polarizer 102, converged by the electron lens 103, and scanned on the surface of the sample 4 on the stage 6. The scanning can be performed in the X and Y directions. In this example, a reference for an irradiation direction of the beam b1 with respect to the sample 4 on the stage 6 is the Z direction.

When the surface of the sample 4 is irradiated with the beam b1, secondary electrons or the like are emitted from the surface of the sample 4 as the secondary charged particles b2. The detector 7 detects the secondary charged particles b2 as the detection signal d1. Since the detector 7 has two-dimensionally arranged elements, the detector 7 can detect the two-dimensional image of the secondary charged particles b2. The control unit 14 detects and acquires the secondary electron signal from the detector 7 as the detection signal d1 in synchronization with the scanning signal of the beam b1 in the control signal of the electron optical system.

The image processing unit 15 generates a secondary electron image based on the detection signal d1. This image has pixels arranged two-dimensionally, and each pixel has information such as luminance. The image display unit 16 displays the secondary electron image generated by the image processing unit 15 on a display screen. The user U1 can see the image on the display screen. In addition, the computer system 2 also stores data of each detection signal, the secondary electron image, and the like in the storage unit 18.

In the first embodiment and the like, for example, a laser light source is applied to the light source 8, and the irradiated light a1 is a laser light. The light a1 can be applied without being limited thereto. As other types of the light, for example, a light obtained by spectroscopically separating white light and condensing a specific spectrum can be applied.

The charged particle beam apparatus 1 can irradiate the object on the stage 6 with the light a1 from the light source 8 under the control of the light control unit 13. For example, by irradiating the sample 4 with the light a1, charging of the sample 4 can be suppressed. The light source 8 can control on/off of the irradiation with the light a1 and power under the control. The light source 8 is provided with the light source adjustment stage 9 (in other words, the light source driving mechanism) and the optical system such as a lens. The light source adjustment stage 9 adjusts the position and direction of the light source 8 by driving. By this adjustment, the position and direction of the irradiation with the light a1 onto the object on the stage 6 can be adjusted. The position of the light source 8, for example, the position in each of the illustrated X, Y, and Z directions can be adjusted. The direction of the light source 8, that is, the direction of the irradiation with the light a1 can be adjusted as the direction defined by, for example, the angle θ and the like illustrated in the drawing. The angle θ is an incidence angle with respect to the Z direction.

It is noted that, in the first embodiment and the like, each mechanism is arranged so that the light a1 from the light source 8 is obliquely irradiated with the angle θ with respect to the stage 6 as illustrated in the drawing. This is because the electron optical system and the like are arranged above the stage 6 in the Z direction, and overlapping in the arrangement is avoided. The configuration such as an arrangement of each mechanism is not limited thereto. For example, a configuration can also be employed where an object on the stage 6 is irradiated with the light from the light source 8 arranged at the position different from that in FIG. 1 from a predetermined direction by using an optical system such as a mirror. In addition, the mechanism such as a light source 8 and a photodetector 11 is mounted so that a portion of the mechanism is arranged in the vacuum chamber 12 so that the sample 4 or the like in the vacuum chamber 12 can be irradiated with the light a1 and detected with the light a2. The mounting configuration of these mechanisms is not particularly limited.

The surface of the object on the stage 6, for example, the position adjustment mark 10 or the sample 4 or the like is irradiated with the light a1 emitted from the light source 8, and the light a2 as the secondary light is detected by the photodetector 11 as the detection signal c1. The detection signal c1 is transmitted to the control unit 14 and the image processing unit 16 via a signal line. An example of the photodetector 11 is a CCD camera in which imaging elements are arranged two-dimensionally. The photodetector 11 is not limited to the camera, and any device that can detect changes in light intensity (corresponding luminance) can be employed.

The charged particle beam apparatus 1 controls as follows in order to perform position alignment between the irradiation position of the beam b1 and the irradiation position of the light a1. The charged particle beam apparatus 1 moves the stage 6 so that the state illustrated in FIG. 1 is obtained and arranges the position adjustment mark 10 on the stage 6 at the position X0. The computer system 2 controls the electron optical system from the control unit 14 to control the irradiation position of the beam b1 on the position adjustment mark 10. The computer system 2 also controls the light source 8 and the light source adjustment stage 9 from the light control unit 13 to control the irradiation position of the light a1 on the position adjustment mark 10. Accordingly, the surface of the position adjustment mark 10 at the position Z0 is irradiated with both the beam b1 and the light a1.

The irradiation position of the irradiation with the laser light emitted from the light source 8 on the surface of the position adjustment mark 10 is adjusted by the light source adjustment stage 9 and the optical system. When the position of the light source 8 is changed, the irradiation position of the light a1 is also changed accordingly. When the direction (for example, the angle θ) of the light source 8 is changed, the irradiation position of the light a1 is also changed accordingly.

In the first embodiment and the like, the red wavelength region is used as the light a1 to be irradiated. As the light source 8, one having a single wavelength may be used, a specific wavelength of a visible light source including a required wavelength range may be selected, or the wavelength may be converted by harmonic generation or the like.

The image display unit 16 displays various images such as secondary electron images and also provides the display screen with a GUI for operating the charged particle beam apparatus 1 by the user U1. The user U1 can perform various settings, manipulations of mechanisms, and the like while viewing the display screen.

[1-3. Computer System]

FIG. 2 illustrates a configuration example of the computer system 2. The computer system 2 includes a computer 200, an input device 205, and a display device 206 that are connected to the computer 200. The computer 200 is configured with a processor 201, a memory 202, a communication interface device 203, an input/output interface device 204, a bus interconnecting the components, and the like. For example, the input device 205 such as a keyboard and a mouse, and the display device 206 such as a liquid crystal display are connected to the input/output interface device 204. The communication interface device 203 is also connected to each unit such as a detector 7 in FIG. 1 and performs signal input/output or communication with each unit. In addition, the communication interface device 203 may be connected to an external device (for example, a server) via a predetermined communication interface (for example, LAN) to communicate with the external device.

The processor 201 is configured with, for example, a CPU, a ROM, a RAM, and the like and constitutes the controller of the computer system 2. The processor 201 realizes the functions of the computer system 2 and the respective units such as a control unit 13 in FIG. 1 based on the software program processing. The functions include the adjustment function of position-aligning the irradiation positions of the beam b1 and the light a1.

The memory 202 is configured with a non-volatile storage device or the like and stores various data and information used by the processor 201 and the like. A control program 202A, setting information 202B, detection data 202C, image data 202D, and the like are stored in the memory 202. The control program 202A is a program for realizing functions. The setting information 202B is setting information of the control program 202A and user setting information by the user U1. The setting information 202B may include, for example, information such as a threshold value for control. The detection data 202C is data corresponding to the detection signal d1 from the detector 7 and the detection signal c1 from the photodetector 11. The image data 202D is data of an image to be displayed on the image display unit 16.

[1-4. Position Adjustment Mark]

Figure 3B:
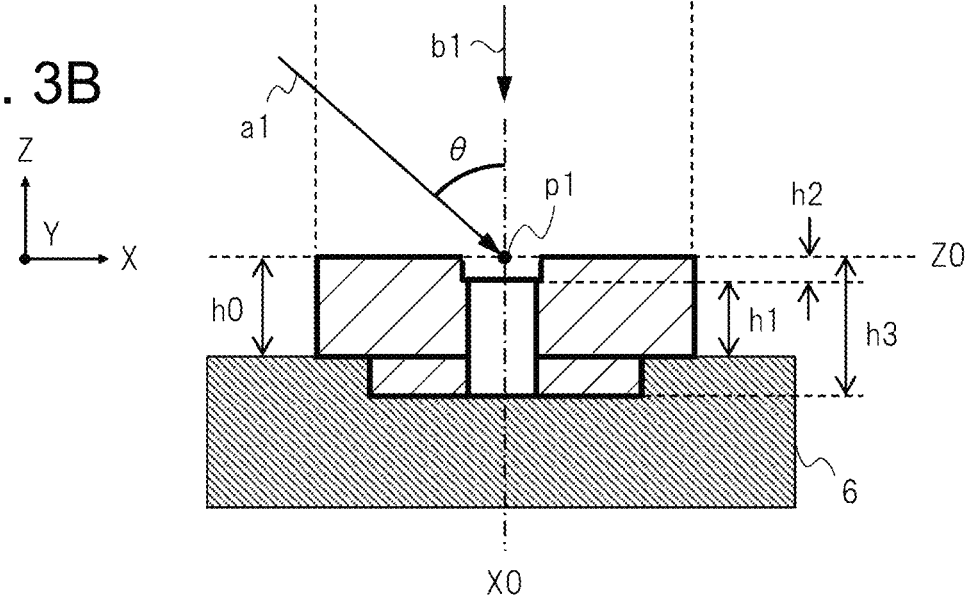

FIGS. 3A and 3B illustrate a configuration example of the position adjustment mark 10. An upper portion FIG. 3A illustrates a configuration of the position adjustment mark 10 viewed from above in the X-Y plane, and a lower portion FIG. 3B illustrates a configuration of the position adjustment mark 10 viewed from the side in the X-Z plane. In the configuration viewed from the upper surface of FIG. 3A, the position adjustment mark 10 is circular with a predetermined diameter R0 and has an upper surface portion 20, a hole 21, and a groove 22. The illustrated point p1 is a center position of the position adjustment mark 10 and the hole 21. The groove 22 has a cross shape in which the X-direction groove and the Y-direction groove are combined, and the width of the groove 22 is the same as a diameter R1 of the hole 21. The hole 21 has a shape of a circle with the diameter R1. The diameter R1 has, for example, a size allowing the hole 21 to be seen within the field of view when the field of view of the charged particle beam apparatus 1 is at the lowest magnification. It is noted that the field of view is a range that can be observed as an image based on the beam b1. For this reason, the diameter R1 of the hole 21 is, for example, on the order of several hundred micrometers.

In the configuration viewed from the side in FIG. 3B, the configuration example is illustrated in which the position adjustment mark 10 is mounted on the stub on the upper surface of a portion of the stage 6. The position adjustment mark 10 may have, for example, a structure capable of being attached to and detached from the stub of the stage 6 in this manner. A portion of the lower surface side of the position adjustment mark 10 becomes a convex portion and is attached and fixed so as to enter the concave portion of the stub. In addition, this example illustrates a case where the irradiation position of the light a1 matches with the center point p1 of the position adjustment mark 10 and the hole 21. The stub is a type of the holder for confirmation provided in a portion of the stage 6, for example, in the vicinity of the periphery. The mode of setting the position adjustment mark 10 is not limited thereto.

The upper surface portion 20 is located at a height reference position Z0 and has a height h0 from the upper surface of the stage 6. The groove 22 has a height h1 from the upper surface of the stage 6 and a depth h2 from the upper surface portion 20 which is the reference position Z0. The hole 21 has a depth h3 from the upper surface portion 20 which is the reference position Z0 and is deeper than the depth h2 of the groove 22. The lower opening of the hole 21 is closed by attaching the stage 6 to the stub.

[1-5. Adjustment Using Position Adjustment Mark]

Figure 4A:
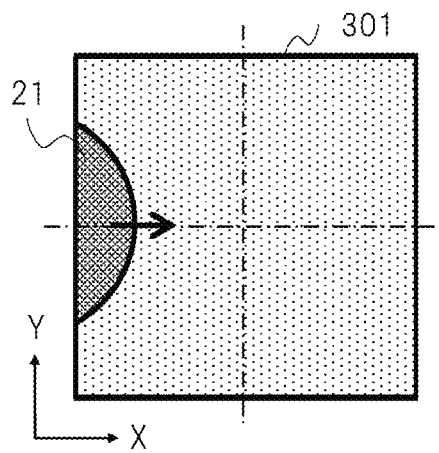
FIGS. 4A to 4E illustrate an example of adjustment using the position adjustment mark in the first embodiment.
Figure 4B:
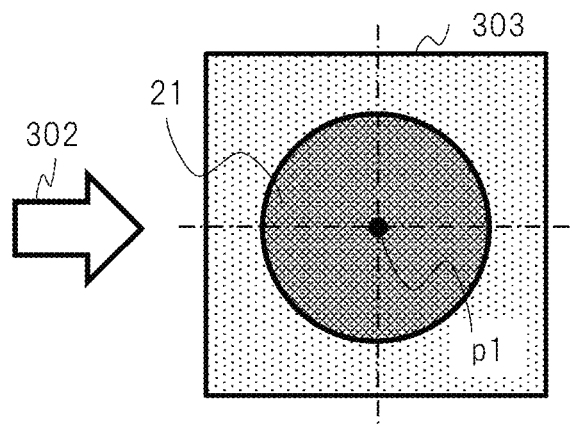
Figure 4C:
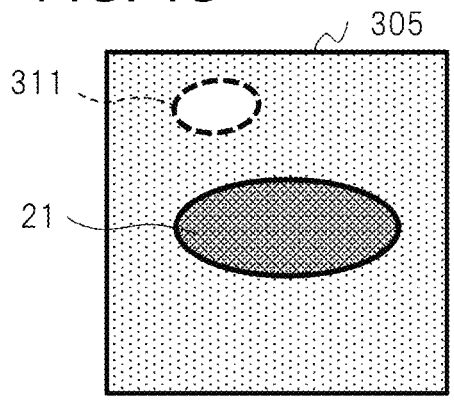
Figure 4D:
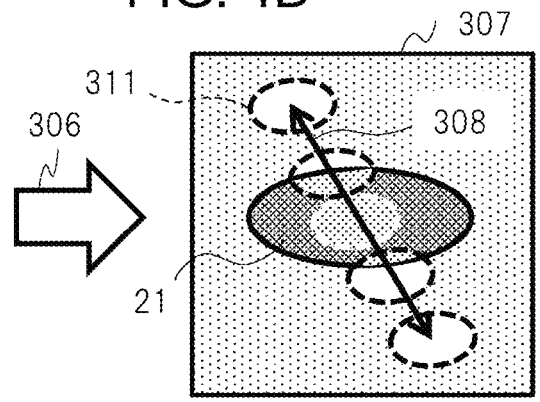
Figure 4E:
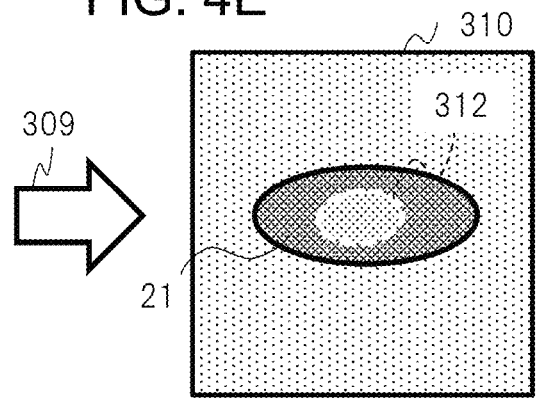

FIGS. 4A to 4E are schematic explanatory diagrams illustrating adjustment of the position alignment between the irradiation position of the beam b1 and the irradiation position of the light a1 by using the position adjustment mark 10 of FIG. 3. FIGS. 4A to 4E illustrate examples of state transition during the adjustment. FIGS. 4A and 4B are examples of the secondary electron images based on the detection signal d1 of the detector 7, which are low-magnification images. FIGS. 4C to 4E are examples of images (photodetector images) based on the detection signal c1 of the photodetector 11. It is noted that FIG. 4 focuses on the hole 21 and omits the groove 22.

First, the user U1 visually confirms the secondary electron image on the image display unit 16. The field of view is of low magnification so that the entire hole 21 of the position adjustment mark 10 is displayed in the image on the display screen. The user performs the manipulation so that the position adjustment mark 10 is reflected within the field of view while viewing the image. The manipulation is a manipulation of the positional relationship changing mechanism. An image 301 of FIG. 4A is a secondary electron image of the field of view and, in this example, has a state where a portion of the hole 21 is visible. While viewing the image, the user U1 performs a manipulation 302 so that the entire hole 21 of the position adjustment mark 10 is visible within the field of view. In particular, user U1 aligns the position of the hole 21 with the center of the field of view by the manipulation 302. An example of the manipulation 302 is to move the stage 6 to the right in the X direction while maintaining a constant field of view. Accordingly, a state of an image 303 as illustrated in FIG. 4B is obtained. In this example, this image 303 illustrates a case where the center point p1 of the hole 21 almost matches with the center point of the field of view (indicated as the intersection of two one-dot dashed lines). By the above-described adjustment of FIGS. 4A and 4B, first, the irradiation position (position X0 in FIG. 1) of the beam b1 corresponding to the center of the field of view and the center point p1 of the position adjustment mark 10 are aligned with each other.

Next, in FIGS. 4C to 4E, adjustment using light a1 is performed. The user U1 visually confirms the image (photodetector image) based on the detection signal c1 of the photodetector 11 on the image display unit 16. It is noted that on the display screen of the image display unit 16, one of the secondary electron image as illustrated in FIGS. 4A and 4B and the photodetector image as illustrated in FIGS. 4C to 4E can be switched and displayed, or both the secondary electron image as illustrated in FIGS. 4A and 4B and the photodetector image as illustrated in FIGS. 4C to 4E can be displayed simultaneously in parallel. First, an image 305 like, for example, FIG. 4C is displayed. The frame of the image 305 may be aligned so as to be the same as the field of view of the secondary electron image. In this photodetector image, the hole 21 of the position adjustment mark 10 and a light 311 are reflected. The light 311 is a light image corresponding to the light a2 which is the secondary light in FIG. 1 and is reflected as the light irradiation area having a light intensity distribution and a light irradiation diameter. In the image, for example, the hole 21 appears black, and the light 311 appears white. As illustrated in FIG. 1, the photodetector 11 is arranged at the oblique position with respect to the position adjustment mark 10, and thus, in the image 305, the hole 21 and the like are obliquely distorted and appear as an elliptical area.

The user U1 changes the position of the light source 8 and the like by moving the light source adjustment stage 9 by a manipulation 306 to change the irradiation position of the light a1 with respect to the position adjustment mark 10. Accordingly, the user U1 searches for the position where the luminance of the light 311 is reduced in the photodetector image by irradiating the hole 21 with the light a1. An image 307 in FIG. 4D illustrates an example of the change of the light 311 during such manipulation 306. A direction 308 indicated by the arrow is an example of the moving direction when changing the irradiation position of the light a1. In this example, the movement direction is set to only one direction 308, but the movement direction is not limited thereto, and movement in each direction is possible according to the manipulation of the mechanism such as a light source adjustment stage 9 or the like. As a result of a manipulation 309 and the search, for example, the user U1 sets a state of an image 310 as illustrated in FIG. 4E as the state where the luminance of the light 311 is the lowest. In this image 310, since the irradiation position of the light a1 is inside the hole 21, the luminance of the light 312 corresponding to the light a1 becomes low.

By the above-described adjustment FIGS. 4C to 4E, the irradiation position (position X0 in FIG. 1) of the beam b1 corresponding to the center of the field of view, the center point p1 of the position adjustment mark 10, and the irradiation position of the light a1 are position-aligned. That is, the irradiation position of the beam b1 and the irradiation position of the light a1 are position-aligned with each other by using the position adjustment mark 10.

[1-6. Groove]

The groove 22 in FIG. 3 is not essential, a configuration where the groove 22 is not provided is possible, and even when the groove is not provided, the same adjustment as in FIG. 4 is possible. In the first embodiment, by providing the grooves 22, three different heights and depths are provided for each portion in the circular area seen from above as illustrated in FIG. 3A. Functions of the grooves 22 include the following. As described in FIG. 4, the user U1 performs manipulations for the position alignment between the irradiation position of the beam b1 and the irradiation position of the light a1 while viewing the image based on the detection signal d1 of the detector 7 and the image based on the detection signal c1 of the photodetector 11. This manipulation includes the manipulation of moving the stage 6, the light source 8, or the like to change the relative positional relationship between the light a1 and the stage 6 (particularly the position adjustment mark 10).

According to this manipulation, the state of luminance due to the irradiation with the light a1 on the position adjustment mark 10 changes within the image in the field of view. Different luminance appears depending on the location (the upper surface portion 20, the groove 22, and the hole 21) irradiated with the light a1. It is noted that the irradiation position of the light a1 on the X-Y plane is the center point of the light intensity distribution, for example, the point where the intensity peaks.

With the manipulation (for example, the movement of the stage 6) of the user U1, in many cases, first, the irradiation position of the light a1 is on the upper surface portion 20 or the groove 22. Depending on the manipulation, the irradiation position changes from the upper surface portion 20 to the groove 22 or from the groove 22 to the upper surface portion 20. For example, when the irradiation position changes from the upper surface portion 20 to the groove 22, the luminance in the photodetector image is lowered due to the difference in height and depth between the upper surface portion 20 and the groove 22. Therefore, the user U1 can understand that the current irradiation position of the light a1 is within the groove 22 from this change in luminance. Next, depending on the manipulation, the irradiation position of the light a1 is moved along the groove 22 in the X direction or the Y direction. Accordingly, the irradiation position changes, for example, from the groove 22 to the hole 21. At this time, the luminance in the photodetector image is greatly reduced due to the difference in height and depth. Therefore, the user U1 can understand that the current irradiation position of the light a1 is inside the hole 21 from this change in luminance. By doing so, the user U1 can easily align the irradiation position of the light a1 with the vicinity of the center point p1 of the hole 21 of the position adjustment mark 10 so that the luminance of the light in the image becomes lowest according to the manipulation.

[1-7. Change in Luminance According to Light Irradiation Position]

Figure 5A:
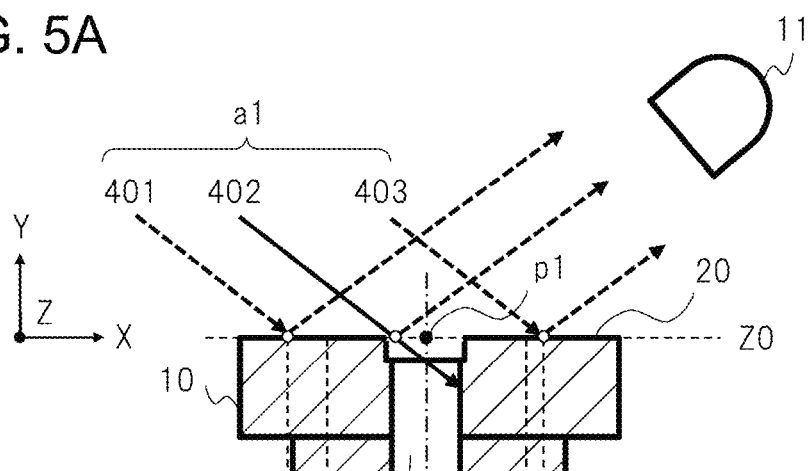
FIGS. 5A and 5B illustrate a change in luminance according to a light irradiation position in the first embodiment.
Figure 5B:
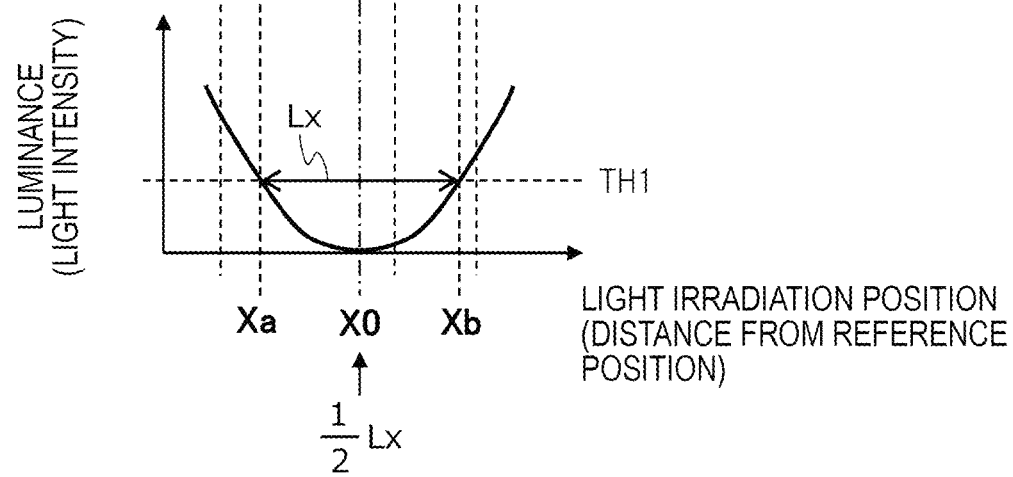

FIGS. 5A and 5B illustrate schematic explanatory diagrams illustrating a change in luminance according to the light irradiation position based on the detection signal c1 of the photodetector 11 when the irradiation position of the light a1 on the position adjustment mark 10 is changed as illustrated in FIG. 4B. The upper portion FIG. 5A illustrates an example of the irradiation position of the light a1 on the position adjustment mark 10 similarly to that of FIG. 3B. Lights 401, 402, and 403 are examples of the irradiation with the light a1. In this example, the irradiation direction (corresponding angle θ) of each light beam is constant, and the irradiation position is different in the X direction. The user U1 moves the irradiation position of the light a1 on the upper surface of the position adjustment mark 10, for example, in the X direction by changing the position of the light source 8 and the like by the light source adjustment stage 9 based on the manipulation. The light 401 and the light 403 are examples where the irradiation position (indicated by white dots) is the upper surface portion 20 or the groove 22, and the light 402 is an example where the irradiation position is inside the hole 21.

In the graph on the lower side of FIG. 5B, the horizontal axis is, for example, the light irradiation position (in other words, a distance from the reference position) in the X direction, and the vertical axis is the luminance (in other words, the corresponding light intensity). As with the light 402, when the irradiation position of the light a1 is inside the hole 21, the luminance decreases as illustrated in the graph. The curve of the graph is a curve where the luminance is lowest around the reference position X0 corresponding to the center point p1 of the hole 21 and the luminance increases as the distance from the position X0 increases.

As described above, the charged particle beam apparatus 1 according to the first embodiment can perform position alignment between the irradiation position of the beam b1 and the irradiation position of the light a1 by the manipulation of the user U1 by using the position adjustment mark 10. Furthermore, the charged particle beam apparatus 1 according to the first embodiment can perform the position alignment as automatic adjustment by processing of the computer system 2 or semi-automatic adjustment for user manipulation support. For the automatic adjustment, the computer system 2 performs the following processing.

The computer system 2 sets a threshold value TH1 of the luminance for control with respect to the graph of FIG. 5B. Positions Xa and Xb indicate positions where the luminance is the threshold value TH1. The position Xa is an example of the position where the luminance starts to decrease from a high state. The position Xb is an example of the position where the luminance starts to increase again from a low state. The computer system 2 calculates such positions Xa and Xb based on the image of the detection signal c1 and the threshold value TH1 and calculates a distance Lx between the positions Xa and Xb. The computer system 2 calculates the position (position X0 in FIG. 5) at half the distance Lx. The computer system 2 aligns the irradiation position of the light a1 with the position of the center with the calculated position as the center. Alternatively, the computer system 2 displays such a position (position X0) as support information on the display screen of the image display unit 16. Then, while viewing the image and the support information, the user U1 may search for the position where the luminance of the light is the lowest, as illustrated in FIG. 4, and align the irradiation position of the light a1 with that position.

[1-8. Effects and Others]

As described above, according to the charged particle beam apparatus 1 according to the first embodiment, the irradiation areas or irradiation positions of the beam b1 and the light a1 can be specified as clearly as possible, and particularly, the irradiation position of the beam b1 and the irradiation position (particularly, the center position of the light intensity distribution) of the light a1 can be aligned with each other with high accuracy. Therefore, according to the first embodiment, the secondary electron image with stable luminance can be acquired.

The charged particle beam apparatus 1 according to the first embodiment irradiates the position adjustment mark 10 with the beam b1 to align the position adjustment mark 10 with the center of the field of view of the secondary electron image while observing the secondary electron image and, then, irradiates the position adjustment mark 10 with the light a1 to detect a change in luminance by the photodetector 11 and observe an image, and adjusts the irradiation position of the light a1 by the light source adjustment stage 9 so that the luminance becomes lowest. Accordingly, the center of the field of view of the secondary electron image can be aligned with the center of the light a1, and the irradiation position of the beam b1 and the irradiation position of the light a1 can be aligned with each other.

Second Embodiment

A second embodiment will be described with reference to FIGS. 6 to 8. The basic configuration of the second embodiment and the like is common to that of the first embodiment, and the other components of the second embodiment and the like different from those of the first embodiment will be described below. The charged particle beam apparatus 1 according to the second embodiment illustrated in FIG. 6 and the like uses a position adjustment sample 60 provided on the stage 6 to perform position alignment between the irradiation position of the beam b1 and the irradiation position of the light a1. This position adjustment sample 60 is a device for position alignment that is different from the normal sample 4 (FIG. 1). When the sample 4 of the observation target is a silicon wafer, the position adjustment sample 60 is configured as a position adjustment wafer corresponding thereto. The position adjustment sample 60 has, for example, substantially the same shape as the sample 4 of the observation target. The structure of the surface of the position adjustment sample 60 is different from that of the sample 4.

[2-1. Overview]

The charged particle beam apparatus 1 according to the second embodiment irradiates the position adjustment sample 60 with the light a1 having a wavelength that activates a junction formed between a silicon wafer and an impurity diffusion layer to remove the charging of the surface of the position adjustment sample 60 and increase the emitted secondary electrons. When irradiating the position adjustment sample 60 with the light a1 and the beam b1, the computer system 2 measures the light intensity distribution appearing in the image generated based on the first detection signal detected by the first detector. Based on this, the computer system 2 calculates a correlation between the irradiation position of the beam b1 and the peak position of the intensity distribution of the light a1. The computer system 2 calculates the amount of change in the positional relationship between the irradiation position of the light a1 and the position of the stage 6 based on the correlation and adjusts the irradiation position of the beam b1 and the peak position of the intensity distribution of the light a1 so as to be position-aligned with each other by controlling the mechanism based on the amount of change to change the positional relationship.

The charged particle beam apparatus 1 according to the second embodiment includes the position adjustment sample 60 arranged on the stage 6 in addition to the components similar to those of the first embodiment. This position adjustment sample 60 has an insulating film formed as a first area, a conductive plug formed as a second area, and an impurity diffusion layer formed under the second area on the surface of the silicon wafer, and the conductive plug and the impurity diffusion layer are periodically arranged on the surface.

[2-2. Charged Particle Beam Apparatus]

FIG. 6 illustrates a configuration of the charged particle beam apparatus 1 according to the second embodiment. The configuration of FIG. 6 mainly differs from the configuration of FIG. 1 in that the position adjustment sample 60 is provided instead of the position adjustment mark 10. During the position alignment, the position adjustment sample 60 is provided on the stage 6 as illustrated in FIG. 6. For example, the position adjustment sample 60 is mounted and fixed on the sample holder 5 on the stage 6. It is noted that, after the position alignment, the sample 4 that is an observation target is provided on the stage 6 and arranged in the field of view based on the manipulation, so that the sample 4 can be observed.

The charged particle beam apparatus 1 irradiates the surface of the position adjustment wafer 60 with the beam b1 and the light a1. Accordingly, the position adjustment sample 60 has a structure in which carriers 612 are generated in a PN junction 65 of the light-irradiated portion in FIG. 7 and the amount of emitted secondary electrons changes.

[2-2. Position Adjustment Sample]

FIG. 7 illustrates a structural example of the position adjustment sample 60 and particularly illustrates a cross section in the vicinity of the surface of the position adjustment sample 60. In the position adjustment sample 60, the PN junction 65 is formed by an N-type semiconductor 62 (in other words, an impurity diffusion layer) formed in the P-type semiconductor substrate 61 by N-type ion doping. A polysilicon (Poly Si) plug 63 is formed as a conductive plug on each PN junction 65 (corresponding N-type semiconductor 62). The side surface of the polysilicon plug 63 is covered with an insulating film 64 such as a $SiO_2$ oxide film. The plurality of polysilicon plugs 63 are arranged in a predetermined cycle on the X-Y plane which is the surface of the position adjustment sample 60. A material used for the polysilicon plug 63 is a material having high transmittance for the wavelength of the light a1 from the light source 8. This material may be changed to a material that matches the wavelength of the light a1 to be used.

The charged particle beam apparatus 1 irradiates the surface of the position adjustment sample 60 with the beam b1 (for example, a beam 601) of low acceleration energy. In this case, secondary electrons 602 are emitted from the surface of the position adjustment sample 60 as the secondary charged particles b2. At this time, the secondary electrons 602 are emitted from the polysilicon plug 63 on the surface, so that the surface of the polysilicon plug 63 is positively charged. Due to the influence of charging 603, the secondary electron image based on the detection of the secondary electrons 602 at this time has a low luminance value and becomes a dark image.

On the other hand, during the position alignment, the charged particle beam apparatus 1 irradiates the surface of the position adjustment sample 60 already irradiated with the beam b1 as described above with the light a1 (for example, a light 611) from the light source 8. The portion where the PN junction 65 exists is irradiated with the light 611 in the wavelength range exceeding the bandgap. The polysilicon plug 63 well transmits the light 611, and the N-type semiconductor 62 and the PN junction 65 are irradiated with the transmitted light. Accordingly, the charged carriers 612 are generated. The generated carriers 612 act to cancel the biased charges due to the positive charging 603 on the surface. Therefore, the amount of secondary electrons 613 emitted from the polysilicon plug 63 irradiated with the light a1 increases again, and the secondary electron image based on the detection of the secondary charged particles b2 has a high luminance value and becomes a bright image.

In this example, as the periodic arrangement of the insulating film 64 and the polysilicon plugs 63 on the surface of the position adjustment sample 60, the polysilicon plugs 63 are arranged in a matrix, but the present disclosure is not limited thereto.

[2-3. Adjustment Using Position Adjustment Sample]

FIGS. 8A and 8B are schematic explanatory diagrams illustrating a display example of the secondary electron image based on the detection signal d1 of the detector 7 during the position alignment using the position adjustment sample 60. This secondary electron image is an image obtained by observing the upper surface of the position adjustment sample 60 when the image corresponding to the field of view is irradiated with both the beam b1 and the light a1.

An image 701 which is the secondary electron image in FIG. 8A illustrate a case where a light 702 which is an irradiation area of the light a1 is enclosed within the field of view indicated by a square. The light 702 is the area having the light intensity distribution centering on the irradiation position of the light a1, in other words, the irradiation diameter and the light image. This example illustrates a case where the irradiation position of the light a1 is substantially aligned with the center of the field of view (indicated by the intersection of two two-dot dashed lines). The size of the field of view is, for example, 100 to 200 µm so that the entire light 702, which is the irradiation diameter of the light a1 can be confirmed. A diameter R63 of the polysilicon plug 63 in FIG. 6 is sufficiently fine with respect to the size of the field of view. For this reason, as illustrated in FIG. 8A, the computer system 2 can acquire the secondary electron image in which the light 702 having a light intensity distribution appears in the portion irradiated with the light a1.

FIG. 8B illustrates an enlarged view of a partial area 703 of FIG. 8A. When the surface of the position adjustment sample 60 is enlarged in this manner, a structure is used in which the plurality of polysilicon plugs 63 are arranged in a matrix. According to the principle described with reference to FIG. 7, the portion (polysilicon plug 63A) irradiated with the light a1 becomes relatively bright, and the portion (polysilicon plug 63B) not irradiated with the light a1 becomes relatively dark. It is noted that the dimensions of the diameter R63 and the interval P63 of the polysilicon plug 63 may be changed according to the size of the field of view used for adjustment, the pixel resolution of the image, and the like.

The light 702 in the image of FIG. 8A has a shape of an ideal circle. In this case, the irradiation position, which is the irradiation center of the light a1, corresponds to the center point of the circle of this light 702. The charged particle beam apparatus 1 corrects the shape, aberration, and the like in the irradiation with the light a1 by mechanisms of the light source 8, lenses, and the like so that the light 702 in the image becomes circular. By allowing the light 702 on the irradiation surface and the image to be circular, the user U1 can more easily adjust the position alignment.

However, since the object on the stage 6 is irradiated with the light a1, for example, from an oblique direction as illustrated in FIG. 6, when there is no correction by the mechanism, bias and distortion occur in the light shape and the intensity distribution in the image. In that case, an effective portion as the irradiation center of the light a1 corresponds to the position where the intensity distribution of the light a1 appears most intensely. Even in this case, the user U1 may adjust the position (the brightest position on the image) where the intensity distribution of the light a1 appears most intensely so as to be aligned with the center of the field of view of the secondary electron image while viewing the secondary electron image. Accordingly, the irradiation position of the beam b1 corresponding to the center of the field of view and the irradiation position of the light a can be aligned with each other through the position adjustment sample 60.

It is noted that, in the image 701 of the field of view having low magnification of FIG. 8A, the plurality of polysilicon plugs 63 on the surface of the position adjustment sample 60 are arranged finely, in other words, the polysilicon plugs 63 are densely arranged, so that the polysilicon plugs 63 cannot almost be seen by the user U1. Thus, the light 702 appears to user U1 as almost one circle rather than multiple circles or clusters of dots. Then, in the circular light 702, the gradation of the brightness appears.

It is noted that, when displaying each image, the computer system 2 may display the center point of the field of view as the support information as an example of a graphical user interface (GUI) and the like. For example, two one-dot dashed lines as illustrated may be displayed as an image of lines representing the center of the field of view.

[2-4. Effects and Others]

According to the charged particle beam apparatus 1 according to the second embodiment, the irradiation position of the beam b1 and the irradiation position of the light a1, particularly the peak position of the light intensity distribution can be aligned with each other based on the first detection signal during the irradiation with the beam b1 and the light a1. Accordingly, the secondary electron image with stable luminance can be obtained.

The charged particle beam apparatus 1 according to the second embodiment adjusts the irradiation position of the light a1 by the light source adjustment stage 9 or the like while observing the secondary electron image obtained by irradiating the position adjustment sample 60 with the beam b1 and the light a1 so that the portion with the highest luminance of the light irradiation diameter is aligned with the center of the field of view. According to the second embodiment, like the example of the background art, without using the mechanism for aligning the light irradiation position based on the difference between the first detection signal during the beam irradiation and the second detection signal during the light irradiation, the irradiation position of the beam b1 and the irradiation position of the light a1 can be aligned with each other by acquiring only the detection signal d1 during the irradiation with the beam b1 and the light a1.

In the second embodiment, as illustrated in FIG. 7, by using the position adjustment sample 60 having a structure that increases the secondary electrons emitted in response to the irradiation with the beam b1 and the light a1 to increase the brightness, even though the photodetector 11 is not used, the intensity distribution of the light a1 can be visually confirmed as the light irradiation diameter (light 702) in the secondary electron image. The user U1 can easily visually confirm the intensity distribution of the light a1. Accordingly, the irradiation position of the beam b1 and the peak position of the intensity distribution of the light a1 can be aligned with each other with high accuracy.

In the second embodiment, when the position adjustment sample 60 is used, the detection signal d1 from the detector 7 may be used, and the detection signal c1 from the photodetector 11 is not used. In the second embodiment, the photodetector 11 can be used for the purpose of confirmation and the like of the light intensity distribution during irradiation with the light a1. As Modified Example, a form in which the photodetector 11 is not provided is also possible.

The position adjustment sample 60 is not limited to a form in which the wafer is used as it is. As the position adjustment sample 60, an object manufactured as the wafer may be used by cutting into a suitable size that can be mounted on the stage 6 of the charged particle beam apparatus 1.

In the example of the present disclosure, the case is assumed where the difference between the irradiation position of the beam b1 and the irradiation position of the light a1 is on the order of several tens of micrometers, and the case is assumed where the size (diameter R63) of the polysilicon plug 63 of the position adjustment sample 60 is on the order of several micrometers. That is, the size of the points constituting the light 702 on the image is sufficiently small with respect to the distance of the difference between the irradiation positions that are adjustment targets. The size is not limited thereto, and other sizes of components are also applicable.

Third Embodiment

A third embodiment will be described with reference to FIGS. 9 and 10. A charged particle beam apparatus 1 according to the third embodiment illustrated in FIG. 9 and the like performs position alignment between the irradiation position of the beam b1 and the irradiation position of the light a1 as two-step adjustment using both the position adjustment mark 10 described in the first embodiment and the position adjustment sample 60 described in the second embodiment. In the charged particle beam apparatus 1 according to the third embodiment, coarse adjustment (referred to as first adjustment) is first performed by using the position adjustment mark 10, and then, fine adjustment (referred to as second adjustment) is performed by using the position adjustment sample. The second adjustment denotes adjustment of making the position alignment result with higher accuracy than the position alignment result in the first adjustment.

It is noted that, in the third embodiment, although the case is illustrated where the position adjustment mark 10 is used for the coarse adjustment (first adjustment), and the position adjustment sample 60 is used for the fine adjustment (second adjustment), the case is not limited to the use of such a relationship. The charged particle beam apparatus 1 according to the third embodiment may perform adjustment of the position alignment using, for example, an object (the position adjustment mark 10 or the position adjustment sample 60) selected by the user U1.

[3-1. Charged Particle Beam Apparatus]

FIG. 9 illustrates a configuration of the charged particle beam apparatus 1 according to the third embodiment. The configuration of FIG. 9 mainly differs from the configurations of FIGS. 1 and 6 in that both the position adjustment mark 10 and the position adjustment sample 60 are arranged on the stage 6. The configuration of the position adjustment mark 10 is the same as that of the first embodiment, and the configuration of the position adjustment sample 60 is the same as that of the second embodiment. The charged particle beam apparatus 1 can arrange the position adjustment mark 10 or can arrange the position adjustment sample 60 at the reference position X0 (the reference position for irradiation with the beam b1 in the X direction) by, for example, controlling the movement of the stage 6 as the positional relationship changing mechanism. FIG. 9 illustrates a state where the position adjustment mark 10 is arranged at the reference position X0.

[3-2. Processing Flow]

FIG. 10 illustrates a flow including processing and operations for a case of performing position alignment between the beam b1 and the light a1 in the charged particle beam apparatus 1 according to the third embodiment and has steps S101 to S108. This flow is mainly divided into a first adjustment indicated by steps S101 to S103 and a second adjustment indicated by steps S104 to S106.

In step S101, the computer system 2 arranges the position adjustment mark 10 at the reference position irradiated with the beam b1 by drive control of the positional relationship changing mechanism (for example, the stage 6). In step S102, the computer system 2 irradiates the position adjustment mark 10 with the beam b1 under the control of the control unit 14 and generates and displays the secondary electron image based on the detection signal d1 of the detector 7. The user U1 adjusts the position adjustment mark 10 so as to be aligned with the center of the field of view by performing manipulations while viewing the image (similarly to (A) of FIG. 4).

In step S103, the computer system 2 irradiates the position adjustment mark 10 with the light a1 under the control of the light control unit 13 and generates and displays the photodetector image based on the detection signal c1 of the photodetector 11. The user U1 adjusts the irradiation position of the light a1 so as to be aligned with the position adjustment mark 10 (corresponding irradiation position of the beam b1) by performing manipulations while viewing the image (similarly to (B) of FIG. 4). Accordingly, the first adjustment is ended.

Next, in step S104, the computer system 2 arranges the position adjustment sample 60 at the reference position irradiated with the beam b1 by drive control of the positional relationship changing mechanism (for example, the stage 6). In step S105, the computer system 2 irradiates the position adjustment sample 60 with the beam b1 under the control of the control unit 14. At the same time, the computer system 2 irradiates the position adjustment sample 60 with the light a1 under the control of the light control unit 13. The computer system 2 generates and displays the secondary electron image based on the detection signal d1 of the detector 7.

In step S106, the user U1 adjusts the irradiation position (the center of the light intensity distribution of the light irradiation area) of the light a1 so as to be aligned with the center (the irradiation position of the corresponding beam b1) of the field of view by performing manipulations while viewing the image (similarly to FIG. 8). Accordingly, the second adjustment is ended.

In step S107, the computer system 2 arranges the sample 4 of the observation target at the reference position that has been position-aligned by driving and controlling the positional relationship changing mechanism (for example, the stage 6). In step S108, the computer system 2 irradiates the sample 4 with the beam b1 and the light a1 by controlling the mechanism, obtains the secondary electron image based on the detection signal d1, and performs observation of the sample 4.

[3-3. Effects and Others]

According to the charged particle beam apparatus 1 according to the third embodiment, first, coarse adjustment (first adjustment) can be performed by using the position adjustment mark 10 having a structure capable of aligning the light a1 with the position where the luminance is lowered by irradiating with the light a1 (laser light). After that, fine adjustment (second adjustment) for aligning the light intensity distribution with the beam irradiation position appearing in the first detection signal obtained by irradiating with the light a1 and the beam b1 can be performed by using the position adjustment sample 60 having a structure that has the portion capable of well transmitting and absorbing the wavelength band of the light a1 (laser light). According to the third embodiment, by performing such a two-step adjustment while the user U1 performs the manipulation while viewing the image, the position alignment between the irradiation position of the beam b1 and the irradiation position of the light a1 can be realized efficiently with high accuracy. Furthermore, according to the third embodiment, the fine adjustment (second adjustment) can also be automated, and thus, the adjustment of the positional relationship between the light a1 and the beam b1 can be realized with less and easy work of the user U1.

Fourth Embodiment

A fourth embodiment will be described with reference to FIGS. 11 to 13. The fourth embodiment is Modified Example of the first embodiment.

[4-1. Charged Particle Beam Apparatus]

FIG. 11 illustrates a configuration of a charged particle beam apparatus 1 according to the fourth embodiment. In the charged particle beam apparatus 1 according to the fourth embodiment, since the photodetector 11 of FIG. 1 described above is unnecessary, the photodetector 11 is not provided, and one detector 7B is provided as the detection system. The energy filter 7C is arranged on the incident side of the detector 7B. The control unit 14 is connected to the detector 7B and the energy filter 7C. The control unit 14 controls switching of the energy filter 7C and the like. The control unit 14 acquires the detection signal e1 from the detector 7B.

Photoelectrons a3 are generated in response to the irradiation with the light a1 from the light source 8 onto the object on the stage 6. The detector 7B detects both the secondary charged particles b2 generated by the irradiation with the beam b1 and the photoelectrons a3 generated by the irradiation with the light a1. There is an energy difference between the secondary charged particles b2 derived from the irradiation with the beam b1 and the photoelectrons a3 derived from the irradiation with the light a1, and the secondary charged particles b2 have higher energy than the photoelectrons a3.

In the fourth embodiment, the computer system 2 controls detection according to the case and time when it is desired to detect the secondary charged particles b2 based on the beam b1 and the case and time when it is desired to detect the photoelectrons a3 based on the light a1. As a specific example of the control, the control unit 14 determines and detects the secondary charged particles b2 and the photoelectrons a3 by the detector 7B by performing the control of the switching and the like of the energy filter 7C. The detection signal e1 becomes the detection signal of the secondary charged particles b2 or the detection signal of the photoelectrons a3 as the signal of which content corresponds to the control of the switching and the like at that time.

The energy filter 7C is, for example, a filter that cuts off a predetermined energy component and passes other predetermined energy components. The computer system 2 detects the secondary charged particles b2 as the detection signal e1 by controlling the energy filter 7C to be in the first state according to the case and time when it is desired to detect the beam b1. The computer system 2 detects the photoelectrons a3 as the detection signal e1 by controlling the energy filter 7C to be in the second state according to the case and time when it is desired to detect the photoelectrons a3. The control of the energy filter 7C may be switching between insertion and non-insertion of the energy filter 7C on the incident side of the detector 7B. The image processing unit 15 generates the secondary electron image or the photoelectron image based on the detection signal e1. The image display unit 16 displays these images.

Similarly to the first embodiment, when performing the position alignment, the charged particle beam apparatus 1 according to the fourth embodiment irradiates the position adjustment mark 10 on the stage 6 with the beam b1 and the light a1 and displays the secondary electron image or the photoelectron image based on the detection signal e1 of the detector 7B. The photoelectron image is an image in which the luminance of the photoelectrons a3 is reflected, like the photodetector image in (B) of FIG. 4. The user U1 can align the irradiation position of the beam b1 with the irradiation position of the light a1 by operating the positional relationship changing mechanism (for example, the stage 6 or the light source adjustment stage 9) while viewing these images.

[4-2. Position Adjustment Mark]

Figure 12A:
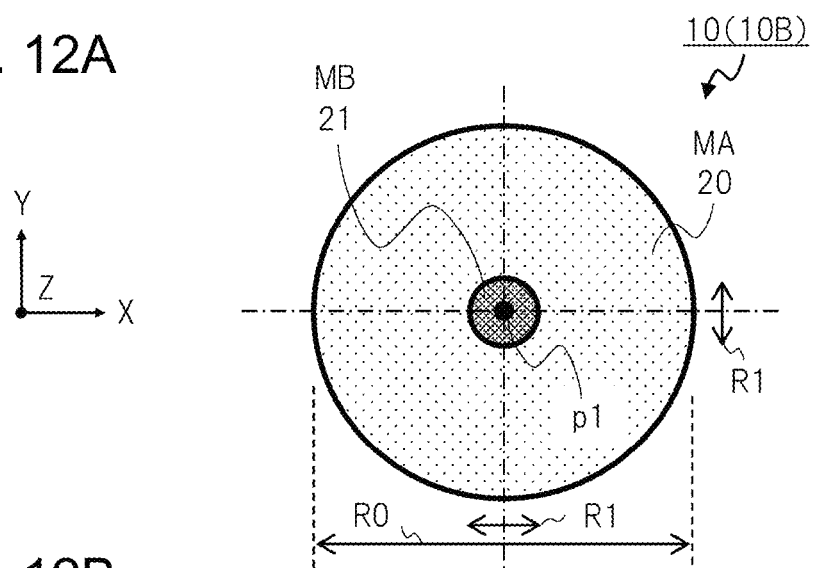
FIGS. 12A and 12B illustrate a configuration example of a position adjustment mark in the fourth embodiment.
Figure 12B:
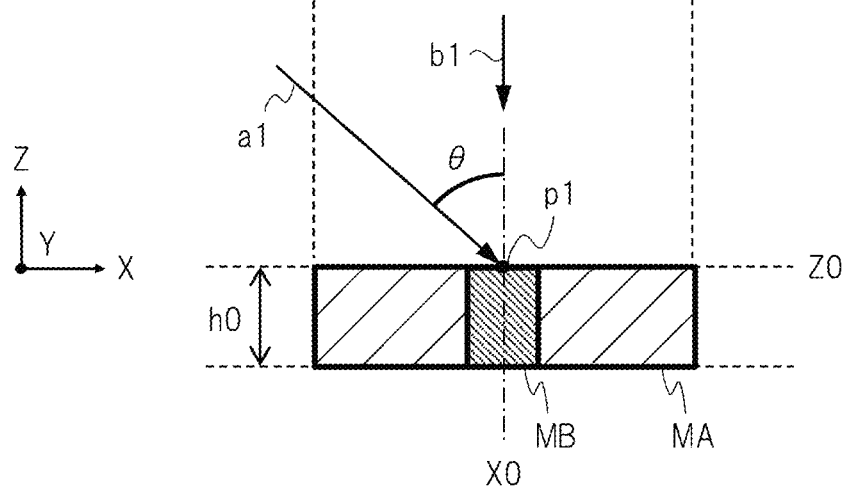

FIGS. 12A and 12B illustrate a configuration example of the position adjustment mark 10 (10B) according to the fourth embodiment. This position adjustment mark 10B has a structure corresponding to the case of using a photoelectric effect based on the configuration including the detector 7B in FIG. 11. The position adjustment mark 10B has, for example, the circular upper surface portion 20 and the center hole 21 in the configuration viewed from the above in FIG. 8A. The position adjustment mark 10B has, for example, a constant height h0 in the configuration viewed from the side in FIG. 8B.

In the position adjustment mark 10B, the upper surface portion 20 is made of a material MA, and the hole 21 is made of a material MB without being hollow. The material MA has a first material, and the material MB has a second material. Those materials have a predetermined relationship. The predetermined relationship is, for example, a relationship about a critical frequency $v_0$. The critical frequency $v_0$ of the material MA is denoted by $v_{0A}$, and the critical frequency $v_0$ of the material MB is denoted by $v_{0B}$. The predetermined relationship is $v_{0B} > v_{0A}$, and the critical frequency $v_{0B}$ of the material MB is higher than the critical frequency $v_{0A}$ of the material MA. Due to the structure having such a material relationship, the distribution regarding the amount of the photoelectrons a3 generated with respect to the light a1 is formed on the surface of the position adjustment mark 10B. In this example, the upper surface portion 20 and the hole 21 are formed as at least two types of areas. The amount of the photoelectrons a3 when the irradiation position of the light a1 is the hole 21 is lower than the amount of the photoelectrons a3 when the irradiation position of the light a1 is the upper surface portion 20.

[4-3. Change in Luminance According to Light Irradiation Position]

FIG. 13 illustrates a change in the amount of the photoelectrons a3 detected according to the irradiation position of the light a1 (laser light) on the position adjustment mark 10B in FIG. 12. The photoelectrons a3 and a reflected light a4 are generated in response to the irradiation of the light a1. The lower graph illustrates the relationship between the irradiation position of the light a1 in the X direction and the amount of the photoelectrons a3. In the graph of this example, when the irradiation position of the light a1 is on the upper surface portion 20 (material MA) and when the irradiation position of the light a1 is on the hole 21 (material MB), there is roughly a difference between EA and EB in the amount of the photoelectrons. The charged particle beam apparatus 1 according to the fourth embodiment detects such photoelectrons a3 from the position adjustment mark 10B as a detection signal e1 by the detector 7B. Since the user can visually confirm the change in luminance corresponding to the change in the amount of the photoelectrons a3 from the photoelectron image based on the detection signal e1, the user can easily perform the position alignment. In addition, similarly to the first embodiment, the computer system 2 can adjust the position alignment between the irradiation position of the beam b1 and the irradiation position of the light a1 by detecting and determining the difference in the amount of the photoelectrons a3.

In the case of using the photoelectrons a3 due to the photoelectric effect, the position adjustment mark 10 is not limited to the structure based on the difference in material described above, and a structure based on a difference in shape as in the example of FIG. 3 can also be applied.

Fifth Embodiment

A fifth embodiment will be described with reference to FIGS. 14 to 19. The fifth embodiment has a function (automatic adjustment function) of automatically aligning the irradiation position of the light a1 with the irradiation position of the beam b1. Accordingly, the position alignment can be performed with minimum manipulation by the user U1. The user U1 may perform the adjustment by using only the automatic adjustment function, or may perform the adjustment by the automatic adjustment function after performing the adjustment to some extent that the manipulation is performed by itself in the same manner as in the above-described embodiments.

[5-1. Charged Particle Beam Apparatus]

FIG. 14 illustrates a configuration of the charged particle beam apparatus 1 according to the fifth embodiment. The charged particle beam apparatus 1 according to the fifth embodiment includes a lens 51 and a lens adjustment stage 52 on an emission side of the light source 8 in addition to the configuration including the position adjustment sample 60 of FIG. 6 of the second embodiment. The lens adjustment stage 52 is connected to the lens 51. The light control unit 13 controls driving of the light source 8, the light source adjustment stage 9, and the lens adjustment stage 52.

The charged particle beam apparatus 1 can change the irradiation direction of the light a1 from the light source 8 by adjusting the lens 51 under the drive control of the lens adjustment stage 52. Accordingly, together with the control of the position of the light source 8, the irradiation position and the angle θ of the light a1 with respect to the irradiation surface on the stage 6 can be changed. In addition, by designing the optical system using the lens 51, the lens adjustment stage 52, and the like, the shape of the light irradiation area on the irradiation surface on the stage 6 can be corrected so as to be close to the ideal circle. It is noted that such a mechanism may be similarly provided in the above-described first embodiment and the like.

[5-2. Automatic Adjustment]

Hereinafter, the automatic adjustment for automatically position-aligning the irradiation position of the beam b1 and the irradiation position of the light a1 in the fifth embodiment will be described.

Figure 15A:
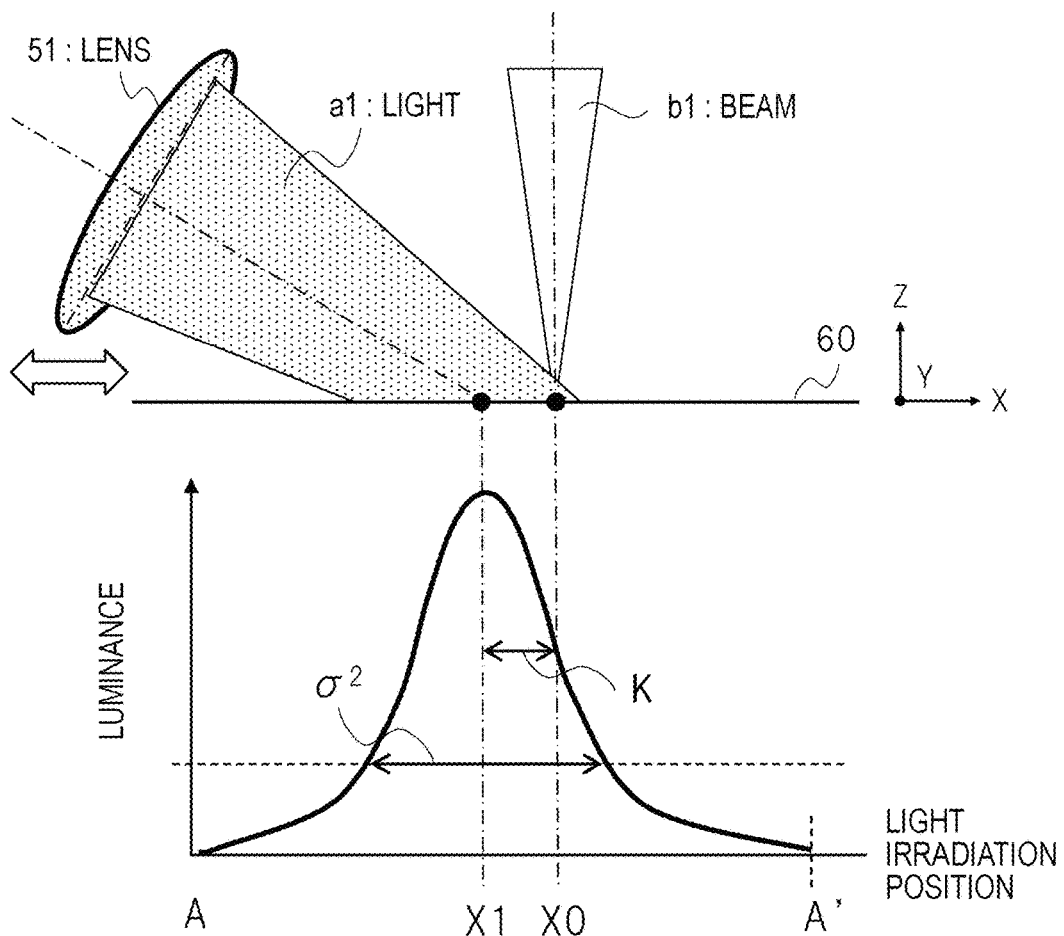
FIGS. 15A and 15B illustrate automatic adjustment in the fifth embodiment.
Figure 15B:
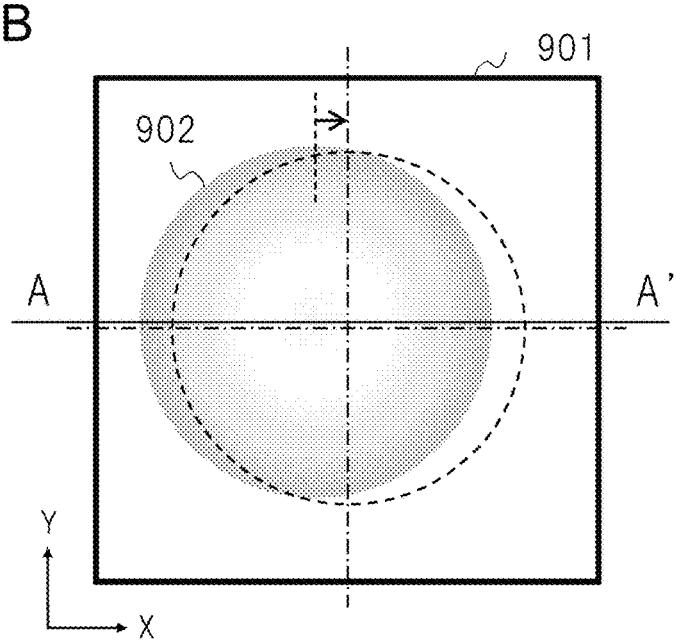

FIG. 15 is a schematic explanatory diagram of a processing procedure of the automatic adjustment. The charged particle beam apparatus 1 irradiates the position adjustment sample 60 on the stage 6 with the beam b1 and the light a1. At that time, the secondary electron image based on the detection signal d1 has a light intensity distribution as illustrated in the graph of FIG. 15. The computer system 2 can align the irradiation positions of the beam b1 and the light a1 by measuring this light intensity distribution. The position of the lens 51 can be changed, for example, in the X direction by the lens adjustment stage 52, so that the irradiation position of the light a1 on the irradiation surface can be changed.

The graph of FIG. 15 illustrates a distribution function, in which the horizontal axis is the irradiation position (distance from the reference position) of the light a1 with respect to the surface (for example, the X direction) of the position adjustment sample 60 and the vertical axis is the luminance (corresponding intensity) of the light a1. The reference position for the irradiation with the beam b1 is denoted by X0. When the irradiation position of the light a1 is, for example, a position X1, the light intensity distribution becomes the distribution function as illustrated. The position X1 is a peak position with the highest luminance and is the center of the intensity distribution of the light a1. The computer system 2 grasps such a distribution function based on the detection signal d1. $\sigma^2$ is a variance in the distribution function. The computer system 2 calculates a distance K between the reference position X0 corresponding to the irradiation position of the beam b1 and the position X1 of the peak of the luminance from the distribution function. This distance K is a difference between the irradiation position of the light a1, particularly, the center position of the light intensity distribution and the irradiation position of the beam b1 at that time, in other words, a positional shift. Therefore, the computer system 2 performs feedback control to the positional relationship changing mechanism so as to reduce the distance K. The computer system 2 controls, for example, the light source adjustment stage 9 and the lens adjustment stage 52 to change the position of the light source 8 and the irradiation direction of the light a1 and allows the irradiation position of the light a1 to be close to the reference position X0 so as to reduce the distance K. By repeating this control as a feedback control loop, the distance K can be gradually close to zero.

An image 901 of the field of view in (B) of FIG. 15 is a secondary electron image in which the position adjustment sample 60 is reflected, corresponding to the example of (A). A light 902 is an example of the irradiation diameter of the light a1 having a light intensity distribution and has an ideal circular shape due to correction. As described above, due to the structure of position adjustment sample 60, the light 902 is visible on the secondary electron image. A cross section of A-A' in the X direction corresponds to the distribution function of (A). During feedback control in the automatic adjustment, for example, the charged particle beam apparatus 1 changes the position of the light source 8 in the X direction, or changes the irradiation direction of the light a1 according to the control of the lens 51 to allow the position X1 of the peak of the distribution function corresponding to the irradiation position of the light a1 to be close to the reference position X0 in the X direction. When viewed from the user U1, the center of the light intensity distribution, which is the brightest portion of the light 902 becomes close to the center of the field of view. Accordingly, the center of the light intensity distribution as the irradiation position of the light a1 can be gradually aligned with the center (reference position X0) of the field of view. Similar control is also performed in the Y direction.

[5-3. Processing Flow]

FIG. 16 is a processing flow relating to the automatic adjustment in FIG. 15 and has steps S161 to S165. In step S161, the charged particle beam apparatus 1 irradiates the position adjustment sample 60 with the beam b1 and the light a1, and the computer system 2 measures the light intensity distribution appearing in the secondary electron image at that time. In step S162, the computer system 2 assumes that the measured light intensity distribution is similar to the Gaussian distribution function and fits the measured light intensity distribution to the Gaussian distribution function.

Next, in step S163, the computer system 2 calculates the distance K which is the difference between the peak position of the distribution function and the irradiation position (reference position X0) of the beam b1 from the formula of the distribution function. The distance K can be calculated, for example, based on Formula 1 below. x in Formula 1 is the position in the X direction.

$$f(x) = \frac{1}{\sqrt{2\pi\sigma^2}} \exp\left(-\frac{(x-K)^2}{2\sigma^2}\right) \quad \text{[Formula 1]}$$

In step S164, the computer system 2 performs control of feeding back the calculated distance K with respect to the positional relationship changing mechanism (the lens 51, the lens adjustment stage 52, or the light source adjustment stage 9). Accordingly, the distance K becomes small. In step S165, the computer system 2 determines whether the current value of the distance K is almost zero (K≈0). More specifically, the computer system 2 determines whether the distance K becomes a predetermined threshold value TK or less (K≤TK). When the distance K is almost 0 (Y), it is considered that the optimum position alignment is adjusted, and this flow is ended, and when the distance K is not 0 (N), the process returns to step S161, and the similar feedback control and the like are repeated. It is noted that there is no particular limitation as to which of the positional relationship changing mechanisms is used in the above-described control.

[5-4. Modified Example—Automatic Adjustment]

Figure 17A:
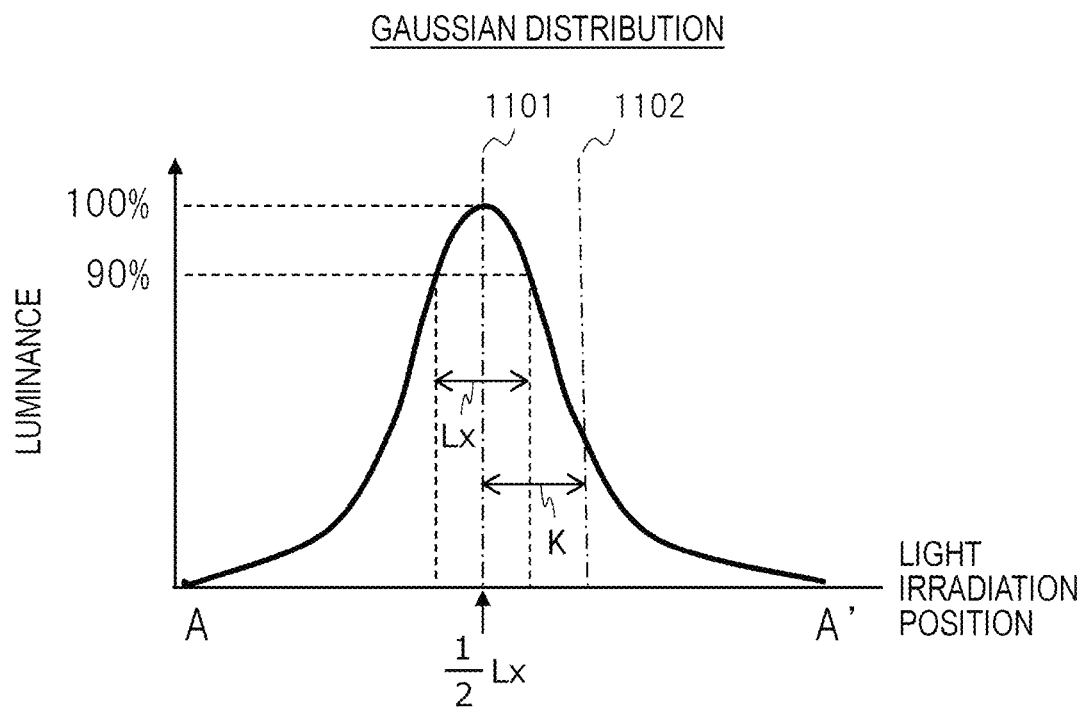
FIGS. 17A and 17B illustrate an automatic adjustment method according to Modified Example of the fifth embodiment.
Figure 17B:
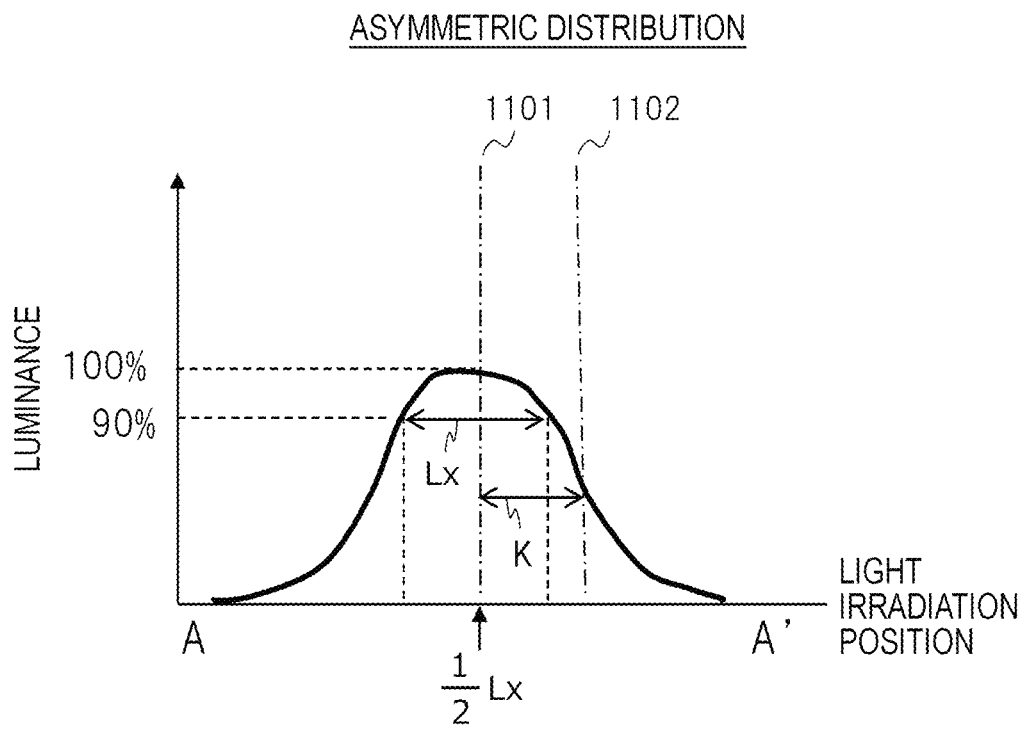

FIGS. 17A and 17B are explanatory diagrams of the automatic adjustment in Modified Example of the fifth embodiment. Herein, an automatic adjustment method different from the above description is illustrated. FIG. 17A illustrates a case of a Gaussian distribution as the distribution function of the light intensity distribution. FIG. 17B illustrates a case of an asymmetric distribution as the distribution function of the light intensity distribution. Reference numeral 1101 denotes the center of the light intensity distribution where the luminance has a peak value, which is the center of the distribution. Reference numeral 1102 denotes the center of the beam corresponding to the irradiation position (reference position X0) of the beam b1.

The computer system 2 calculates the coordinates (position in the X direction) of the light intensity distribution center 1101 of which the width becomes (½) Lx of the width Lx of the graph when the luminance is reduced to 90%, for example, on the assumption that the maximum value of the graph of the light intensity distribution is the luminance of 100%. Next, the computer system 2 calculates the distance K, which is the difference between the coordinates of the light intensity distribution center 1101 and the beam center 1102. The computer system 2 feeds back the obtained distance K to the positional relationship changing mechanism.

According to the automatic adjustment method for Modified Example, the distance K can be similarly calculated even when the graph of the light intensity distribution is an asymmetric distribution as illustrated in FIG. 17B.

[5-5. Effects and Others]

According to the fifth embodiment, by calculating the relative positional relationship between the peak position of the light intensity distribution and the beam position and performing feedback control, the irradiation position of the light a1 is automatically aligned with the irradiation position of the beam b1. Accordingly, highly accurate position alignment can be realized as the automatic adjustment, and the labor for the manipulation of the user U1 can also be reduced.

Sixth Embodiment

A sixth embodiment will be described with reference to FIGS. 18 and 19. The sixth embodiment corresponds to Modified Example of the second embodiment. In the sixth embodiment, the stage 6 has position adjustment stubs (position adjustment stubs or holders) having different heights as position adjustment structures, and the position adjustment sample 60 can be provided on these stubs. In the sixth embodiment, adjustment of the position alignment between the irradiation position of the beam b1 and the irradiation position of the light a can be performed by using the position adjustment samples 60 arranged at positions with different heights. In the sixth embodiment, the position alignment is possible even when the height of the irradiation surface changes.

[6-1. Position Adjustment Stub and Position Adjustment Sample (1)]

FIG. 18 illustrates a configuration example of position adjustment stubs 26 with different heights and the position adjustment sample 60 provided on the position adjustment stubs 26 on the stage 6 in the charged particle beam apparatus 1 according to the sixth embodiment. Three stubs 26A, 26B, and 26C with different heights are provided as position adjustment stubs 26 on a portion of the surface of the stage 6. The stub 26A has a height hA, the stub 26B has a height hB, and the stub 26C has a height hC. hA<hB<hC. The position adjustment sample 60 can be provided on each position adjustment stub 26. A sample 60A is provided on the stub 26A, a sample 60B is provided on the stub 26B, and a sample 60C is provided on the stub 26C. In this example, the central stub 26B and the sample 60B of the three serve as references. It is noted that, although only the X-Z cross section is illustrated, the shape of the position adjustment stub 26 and the position adjustment sample 60 in other directions such as an X-Y plane is not particularly limited, for example, an axisymmetric shape with respect to the Z direction such as a cylinder or a disc may be used.

In this example, the stub 26B and the sample 60B are arranged at the reference position X0 corresponding to the irradiation position of the beam b1 in the X direction. The stub 26B and the sample 60B are arranged at the position XA. The stub 26C and the sample 60C are arranged at the position XC. In this example, the height reference position Z0=0, the upper surface of the stub 26B is arranged in accordance with the reference position Z0, and hB=Z0. The stub 26A is arranged at the position ZA=−100, which is lower than the reference position Z0, and hA=ZA. The stub 26C is arranged at a position ZC=+100 higher than the reference position Z0, and hC=ZC. In this example, three types of heights are provided with the difference of ±100 as described above, but the present disclosure is not limited thereto, and two or more types of heights may be provided. In this example, the position adjustment sample 60 is configured with three samples 60A, 60B, and 60C, but the present disclosure is not limited thereto, a structure in which a plurality of portions having different heights are provided in the plane of one position adjustment sample 60 may be employed.

FIG. 18 illustrates a case where the center of the surface of the sample 60B of the stub 26B at the reference position X0 is irradiated with the beam b1 and the light a1. It is noted that, as the irradiation angles of the light a1, the angle θ with respect to the Z direction and the angle (with respect to the X direction are illustrated. θ+φ=90 degrees.

[6-2. Position Adjustment Stub and Position Adjustment Sample]

Figure 19A:
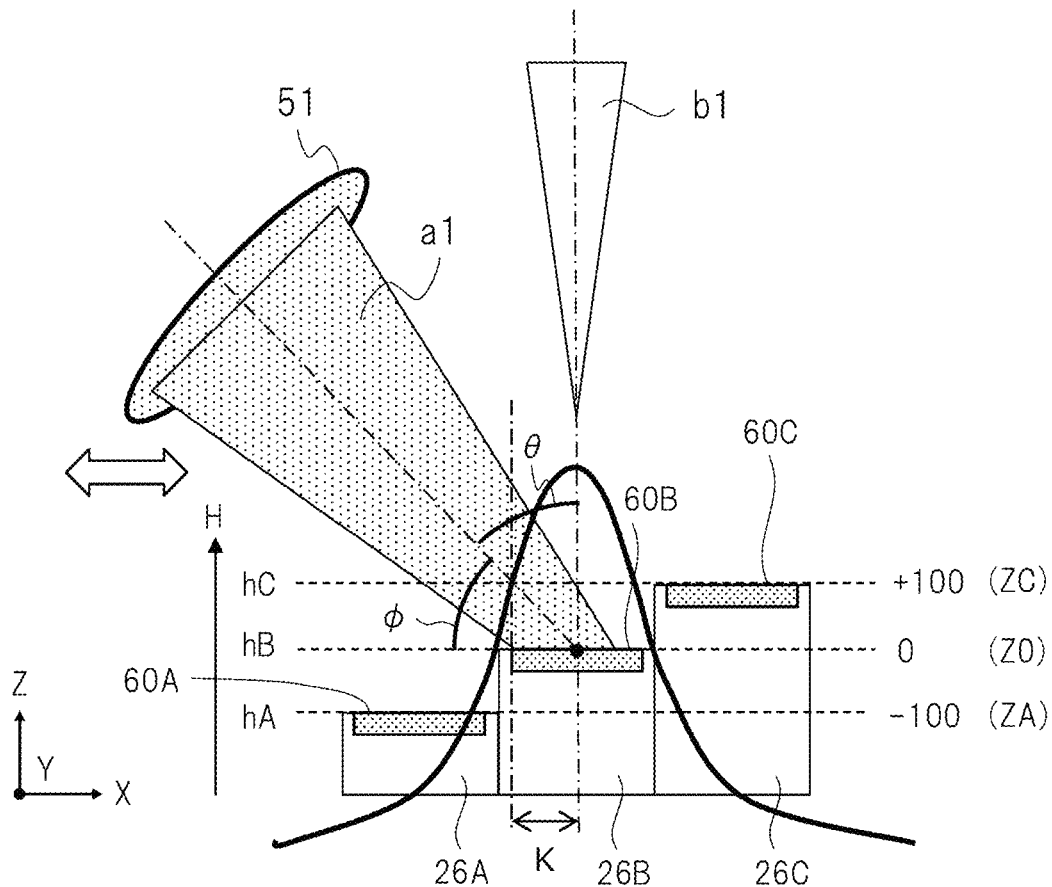
FIGS. 19A and 19B illustrate a light intensity distribution, a relationship between height and distance, and the like in the sixth embodiment.
Figure 19B:
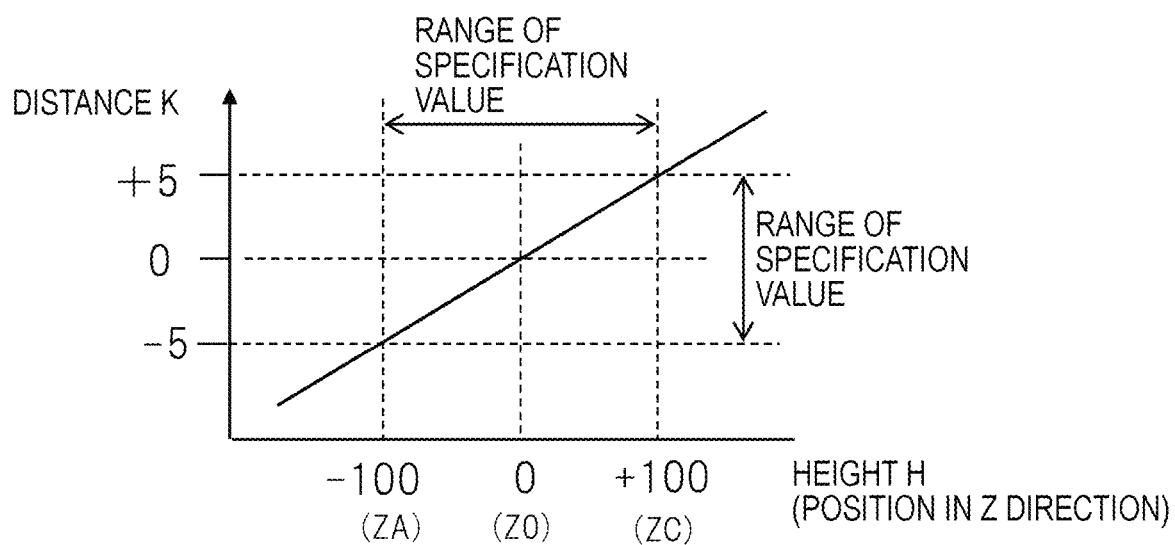

FIG. 19A is a schematic explanatory view illustrating superimposed light intensity distributions when the configuration of the position adjustment stub 26 and the position adjustment sample 60 of FIG. 18 is irradiated with the beam b1 and the light a1. FIG. 19B is the graph illustrating an example of the relationship between a height H and the distance K. In the sixth embodiment, the computer system 2 grasps the relationship between the distance K which is the difference between the peak position of the light intensity distribution and the beam position and the height H of the irradiation position. The height H corresponds to the position in the Z direction. In addition, the computer system 2 grasps the relationship between the distance K and the height H and the change amount of the positional relationship changing mechanism (lens adjustment stage 52 and light source adjustment stage 9) for changing the positional relationship corresponding to the relationship. The amount of change is associated with the amount of operation during the driving and the amount of voltage or the like during the control. The computer system 2 calculates such a relationship in advance and sets information for the control. The computer system 2 adjusts the irradiation mechanism of the light a1 so that the distance K of the positional difference is within a predetermined range of a specification value based on the information when the height H of an irradiation target changes.

The computer system 2 calculates, for example, the distance K when the height H is ZC=+100 based on an elevation angle φ and the height H=hB=Z0=0 from the following Formula 2.

$$\tan \varphi = 100/K \qquad \text{Formula 2}$$

The computer system 2 determines whether the distance K is within a range of the specification value. When the distance K is out of the range of the specification value, the computer system 2 adjusts the elevation angle φ (corresponding angle θ) by the positional relationship changing mechanism and again determines whether the distance K is within the range of the specification value. When the distance K corresponding to the height H is within the range of the specification value by such repetition, the adjustment is ended.

[6-3. Effects and Others]

As described above, according to the sixth embodiment, when observing the plurality of samples 4 having different heights or when observing the sample 4 having the plurality of locations with different heights in the plane, the adjustment of the irradiation position of the beam b1 and the irradiation position of the light a1 can be easily realized so as to be suitable for the height, and the automatic adjustment can also be performed. The charged particle beam apparatus 1 according to the sixth embodiment copes with, as specifications, a predetermined height range (ZA to ZC range of ±100) and a predetermined distance range in the X and Y directions with respect to the adjustment function of the position alignment.

In the above example, the range of the specification value for the height H is set to the range of ±100 from the position ZA to the position ZC, but the range of the specification value is not limited thereto. The height H used for adjustment is not limited to the three types of heights in the above example. These values may be changed according to the specifications of the charged particle beam apparatus 1 and the sample 4. There is no limitation on which mechanism is used when changing the height H (Z direction) by the positional relationship changing mechanism, and the light source adjustment stage 9, the lens adjustment stage 52, the stage 6, and other mechanisms can be used.

Seventh Embodiment

A seventh embodiment will be described with reference to FIGS. 20 to 23. The charged particle beam apparatus 1 according to the seventh embodiment differs from the above-described embodiments mainly in that the irradiation position of the beam b1 can be moved in the X-Y plane to move the field of view itself, and that, in some cases, the position alignment between the irradiation position of the light a1 and the irradiation position of the beam b1 can be adjusted in accordance with the movement of the field of view. In the embodiments so far, the case where the irradiation position of the beam b1 is assumed to be at the constant reference position X0 and the irradiation position of the light a1 and the irradiation position of the beam b1 are adjusted to match with each other has been described. But not limited thereto, for some purposes, the irradiation position of the light a1 and the irradiation position of the beam b1 can be adjusted so as to be shifted, in other words, to be different in a predetermined positional relationship. In the seventh embodiment, an adjustment function capable of coping with such a purpose is provided. The positional relationship between the irradiation position of the beam b1 and the irradiation position of the light a1 changes according to the movement of the irradiation position of the beam b1 and the field of view. In addition, the irradiation conditions and effects (light intensity distribution and the like) of the light a1 may vary depending on the irradiation position of the beam b1. In the seventh embodiment, the irradiation conditions and effects of the light a1 are controlled so as to be uniform for each irradiation position of the beam b1 and each field of view according to the positional relationship between the irradiation position of the beam b1 and the irradiation position of the light a1.

[7-1. Charged Particle Beam Apparatus]

FIG. 20 illustrates the charged particle beam apparatus 1 according to the seventh embodiment. The vacuum chamber 12 is provided with not only a polarizer 102 for scanning but also a polarizer 120 for movement of the field of view. By controlling the polarizer 120, the control unit 14 can move the field of view of the scanning of the beam b1 within the X-Y plane. As described later, a light intensity adjustment mechanism 1400 is provided on the emission side of the light a1 from the light source 8. It is noted that, in the seventh embodiment, the secondary electron image is observed by using the detection signal d1 of the detector 7. The photodetector 11 can be omitted, but when the photodetector 11 is provided, the intensity distribution of the light a1 can be confirmed by using the detection signal c1 of the photodetector 11.

[7-2. Movement of Field of View]

FIG. 21 illustrates an example of the irradiation of the beam b1 and the light a1 (laser light) onto the object on the stage 6 in the X-Y plane in the seventh embodiment and, particularly, illustrates an example of the movement of the field of view due to the movement of the irradiation position of the beam b1 and a plurality of fields of view obtained. FIG. 21 illustrates a positional relationship between a light irradiation area 1300 irradiated with the light a1 and an irradiation position 1301 of the beam b1 on the surface of the target object. A case where the light irradiation area 1300 (in other words, irradiation diameter, light image) is corrected to have an ideal circular shape is illustrated. FIG. 13 is also obtained as the secondary electron image based on the detection signal d1 of the detector 7. The movement of the field of view is also referred to an image shift. When observing the sample 4, there are cases where the plurality of locations (for example, the inspection target locations) of the sample 4 are observed as respective fields of view.

The irradiation position 1301 of the beam b1 is a position when the position matches with the center of the light irradiation area 1300 of the light a1. For example, this irradiation position 1301 corresponds to the aforementioned reference position and can be expressed as, for example, coordinates (X0, Y0). The irradiation position 1301 is irradiated with the beam b1 in the Z direction. Conversely, first, the irradiation position of the light a1 is aligned with this irradiation position 1301. The field of view 1302 is a scanning area of a case where the scanning with the beam b1 in two dimensions (X direction and Y direction) under the control of the polarizer 102 is performed in the state where the field of view 1302 does not move, with the irradiation position 1301 of the beam b1 as the center. The secondary charged particles a2 generated by scanning the field of view 1302 are detected as the detection signal d1 by the detector 7 and can be observed as the secondary electron image of the field of view 1302. It is noted that the position in the field of view as a reference is not limited to the field of view 1302 of the center, and may be any field of view within the area 1350 as a movable range and may be, for example, a field of view v1.

On the other hand, while the stage 6 is maintained to be constant, the irradiation position of the beam b1 can be changed in the X-Y plane under the control of the polarizer 120 for moving the field of view from the control unit 14, and thus, the field of view 1302 can be moved in the X-Y plane. For example, the field of view can move from the field of view 1302 to a field of view 1303. It is noted that the plurality of (25 in this example) fields of view that are candidates are also illustrated as the fields of view v1 to v25 for the purpose of identification.

Since the movement of the field of view by using the polarizer 120 without moving the stage 6 can be realized at a high speed, the movement of the field of view can contribute to the improvement in the throughput in measuring and inspecting a plurality of pattern shapes included in the plurality of fields of view. However, as described above, the light a1 has the light intensity distribution, and the light irradiation conditions and effects differ depending on the position of the light a1 within the light irradiation area 1300. When the light irradiation conditions and effects are different, since the light irradiation conditions and effects also affect the detection of the secondary charged particles b2, it is preferable to stabilize the light irradiation conditions and effects between the plurality of fields of view. However, in the related art, it is difficult to achieve both the improvement in the throughput by using the plurality of fields of view and the stabilization of the light irradiation conditions and effects between the plurality of fields of view. As a countermeasure, controlling the light irradiation area to follow the movement of the field of view, for example, driving the light source adjustment stage 9 to change the position of the light source 8 is also conceivable. However, in the case of the configuration involving such mechanical movement, it is difficult to follow the movement of the field of view due to high-speed electromagnetic polarization or electrostatic polarization.

Therefore, the charged particle beam apparatus 1 according to the seventh embodiment performs controlling of the irradiation with the light a1 according to the position in the field of view so that the irradiation conditions and effects of the light a1 for the plurality of different positions in the field of view can be allowed to be stabilized and uniform without involving the mechanical movement. Specifically, the computer system 2 performs control of adjusting the light intensity of the irradiation with the light a1 (laser light) and the intensity of the beam b1 so that the irradiation conditions and effects of the light a1 are allowed to be uniform regardless of the difference of the positions in the field of view as illustrated in FIG. 21.

In the example of FIG. 21, as the light irradiation conditions and effects, the light intensity is highest at the irradiation position 1301 in the center of the light irradiation area 1300, but the light intensity decreases toward the peripheral positions in the radial direction. In the image, the central field of view 1302 has high luminance, and the peripheral field of view 1303 has relatively low luminance. The computer system 2 performs control to change the irradiation conditions of the light a1, specifically, the light intensity according to the position in the field of view so as to equalize the differences in the light irradiation conditions and effects between these fields of view.

[7-3. Adjustment According to Position of Field of View]

Figure 22A:
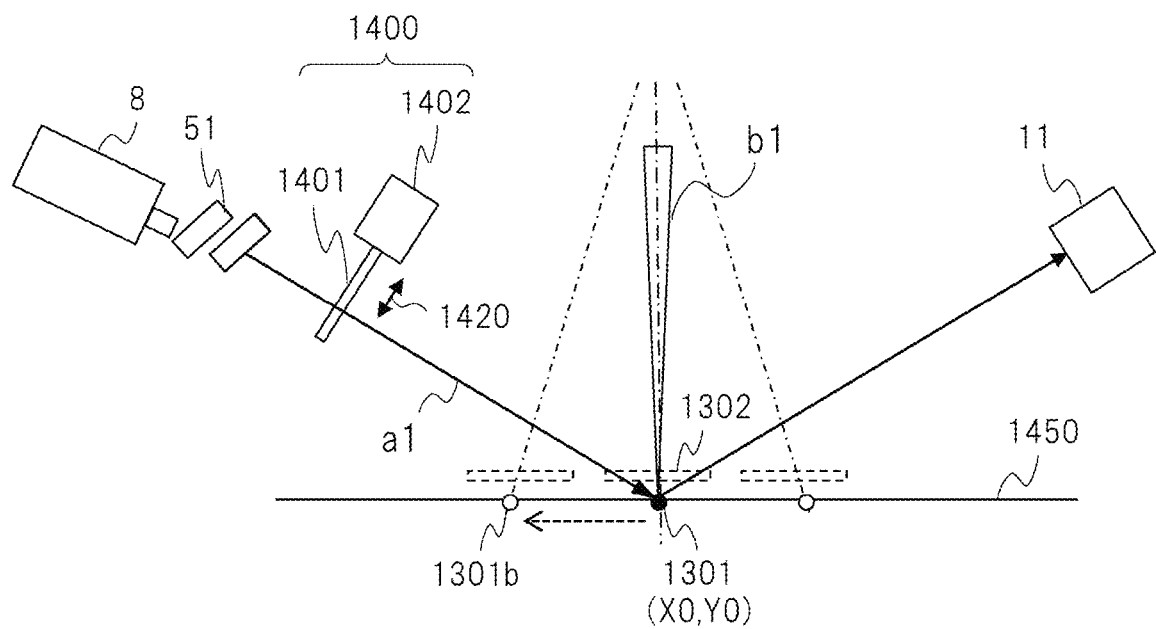
FIGS. 22A and 22B illustrate a configuration example of a light intensity adjustment mechanism in the seventh embodiment.
Figure 22B:
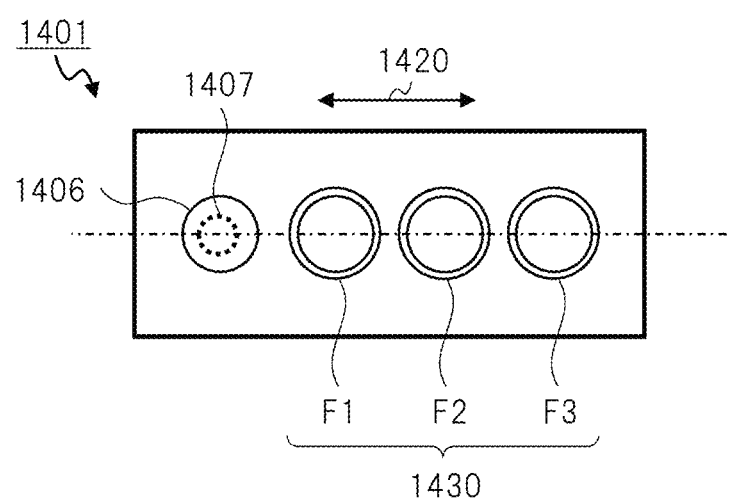

FIGS. 22A and 22B illustrate configuration examples of a mechanism for adjusting the irradiation intensity of the light a1 according to the movement and position in the field of view as illustrated in FIG. 21. This mechanism includes the light intensity adjustment mechanism 1400. According to this configuration example, for example, the irradiation conditions and effects of the light a1 for the central field of view 1302 and the peripheral field of view 1303 in FIG. 21, specifically, the light intensity distribution can be allowed to be uniform.

FIG. 22A illustrates the light intensity adjustment mechanism 1400 arranged on the optical path of the light a1 between the light source 8 and an object 1450 (for example, the sample 4) on the stage 6. The light intensity adjustment mechanism 1400 has, for example, a light attenuation element holding member 1401 and a driving mechanism 1402 for the light attenuation element holding member 1401.

This example illustrates a case where the surface of the target object 1450 is irradiated with the beam b1 at the irradiation position 1301 (X0, Y0) in FIG. 13. As described above, by controlling the beam b1, the irradiation position 1301 can be moved to the irradiation position 1301b or the like, and thus, the field of view 1302 can be moved. The driving mechanism 1402 can drive the light attenuation element holding member 1401 to move the light attenuation element holding member 1401 in the illustrated movement direction 1420 based on the drive control from the light control unit 13. Accordingly, the desired location of the light attenuation element holding member 1401 can be inserted into the optical path of the light a1.

FIG. 22B illustrates a configuration example of the plane perpendicular to the optical path as a plane of the light attenuation element holding member 1401. As illustrated, the light attenuation element holding member 1401 includes a plurality of different neutral density (ND) filters 1430 (F1, F2, and F3), and a light passage opening 1406 is formed. The ND filter is an example of the light attenuation element. The ND filter 1430 is used to limit the amount of the light without wavelength selection in a predetermined wavelength band. The light control unit 13 controls the driving mechanism 1402 to move the light attenuation element holding member 1401 in the movement direction 1420 indicated by the arrow, and thus, positions of a trajectory 1407 of the light a1 are aligned to any one of the ND filters F1 to F3 or the light passage opening 1406. The ND filters F1 to F3 have different light transmittances. In addition, the light passage opening 1406 is provided to allow the light a1 to pass through without restriction. By these switching, the object 1450 such as a sample 4 can be irradiated with the light a1 having a desired intensity.

It is noted that, in the seventh embodiment, the example where the light intensity is adjusted by properly using the ND filters 1430 having different transmittances is illustrated, but the present disclosure is not limited thereto. For example, a variable ND filter that can change the transmittance in a plurality of states with one filter may be employed. A configuration may be employed in which the plurality of ND filters are stacked to obtain a desired transmittance. Furthermore, a configuration may be employed in which the light intensity is adjusted by changing the output of the light a1 (laser light) from the light source 8 itself. Alternatively, a configuration may be employed in which the detection level or the like in the detector 7 or the detector 11 is adjusted.

[7-4. Light Intensity Adjustment Method]

FIGS. 23A to 23C illustrate examples of a light intensity adjustment method according to the position in the field of view. In this example, the configuration example is described where the light irradiation conditions and effects are allowed to be uniform regardless of the position in the field of view by using the ND filter 1430 of the light attenuation element holding member 1401 of the mechanism illustrated in FIG. 22. As described above, the light irradiation effect appears as a specific distribution, for example, a Gaussian distribution. Therefore, in order to stabilize the light irradiation effect within a field-of-view moving area (for example, the area 1350 in FIG. 21), it is preferable to perform correction according to the position in the field of view. More specifically, as illustrated in FIG. 23, the computer system 2 switches the ND filter 1430 according to the position in the field of view so that the feature amount is allowed to be uniform regardless of the position in the field of view. The feature amount is luminance of the desired portion within the field of view or the like.

In the graph on the upper side of FIG. 23A, for example, the horizontal axis is the position in the X direction, and the vertical axis is the feature amount related to the light intensity. A desired value of the feature amount is set for the control. In the lower portion of FIG. 23, an example of the plurality of fields of view similar to those in FIG. 21 is illustrated in correspondence with the positions of the graph. For example, in a field of view 1501 in the periphery in the X direction, the feature amount is approximately f1. In a field of view 1502, the feature amount is approximately f2. In a field of view 1503 at the center of the light irradiation area, the feature amount has a peak value f3.

A light attenuation effect 1511 is set to 0 to be aligned with the value f1 at the position in the field of view 1501, and the light passage opening 1406 is used. The light attenuation effect 1512 matches the value f2 at the position in the field of view 1502, and the first ND filter (for example, the ND filter F1) is used. The light attenuation effect 1513 matches the value f3 at the position in the field of view 1503, and the second ND filter (for example, the filter F2) is used. In this manner, by switching the ND filter, the light attenuation effect at each field-of-view position is adjusted so as to be aligned with the desired value f1 of the feature amount.

In order to perform the switching as described above, the computer system 2 sets and stores, for example, the table as control information for correction of the light attenuation in advance in the memory of a predetermined storage medium.

In this table, for example, field-of-view position information and information including a filter type are set to be associated with each other. The field-of-view position information: includes identification information of the field of view, the polarization amount of the polarizer 120 for moving the field of view, the signal amount, and the like. The computer system 2 controls the driving mechanism 1402 of the light intensity adjustment mechanism 1400 according to the position in the field of view based on the table and switches the insertion state of the ND filter 1430 and the like of the light attenuation element holding member 1401.

For example, when the beam b1 is polarized in the peripheral field of view 1501 (v11), the light a1 is controlled so as to pass through the light passage opening 1406. When polarized in the field of view 1502 (v12), the light is controlled so as to pass through the ND filter F1. When polarized in the central field of view 1503 (v13), the light is controlled so as to pass through the ND filter F2. Due to such control, the light irradiation conditions and effects can be allowed to be uniform regardless of the position in the field of view.

For example, the following method can be applied to generate the above-described table. In advance, the charged particle beam apparatus 1 irradiates, for example, the sample 4 with the light a1 and acquires the feature amount of each field of view while moving the field of view in at least one direction in the state where the light irradiation effect remains. Then, the ND filter is selected according to the field of view so that the feature amounts at these different field-of-view positions are uniform, for example, so that the difference between the feature amounts is less than a predetermined value. In the table, an application relationship between the field-of-view position and the filter type is set. It is noted that, when a mechanism capable of continuously adjusting the light intensity or the amount of the light attenuation is employed as the light intensity adjustment mechanism 1400, the relationship between the light intensity and the amount of the light attenuation according to the position may be set in the table.

It is noted that, when the same control is realized by using the detector 7, the luminance of the specific portion of the field of view is used as the feature amount, the gain and the offset amount of the output circuit of the detector 7 may be determined, and the relationship thereof may be stored in the table so that the feature amounts are uniform according to the field of view. The feature amounts that serve as evaluation standards for light adjustment are not limited to the luminance of the specific position in the field of view, but also the contrast between two or more regions of interest (ROI) in the field of view, pattern dimension values, and the like may be used.

In addition, the relationship between the adjustment amounts for each field-of-view position (or position coordinate) obtained as described above may be defined and stored as a calculation formula such as a function or a program. According to the above-described method, the measurement and inspection based on the stable light irradiation conditions and effects can be efficiently performed regardless of the field-of-view position.

It is noted that, in the example of FIG. 23, the example of calculating and acquiring the correction data in one direction (for example, the X direction) when the light intensity distribution of the irradiation area of the light a1 is corrected to have an ideal circular shape has been described. Herein, as illustrated in FIG. 20 and the like, in the case of the configuration where the light a1 is obliquely incident on the irradiation surface which is the surface of the target object, at an angle θ or the like, in some cases, the light irradiation conditions and effects of the irradiation area of the light the irradiation surface, specifically, the light intensity distribution may be a different distribution for each direction. For example, in some cases, the light intensity distribution may differ between the X direction and the Y direction. In this case, it is preferable to calculate and acquire correction data for each of the plurality of different directions. On the other hand, when almost the same light intensity distribution is illustrated regardless of the direction with respect to the center of the light irradiation area, the correction data acquired in one direction may be commonly applied to each direction. In any case, the correction table or the like may be defined so that the light intensity can be allowed to be uniform according to the field-of-view position, taking the actual light intensity distribution on the irradiation surface into consideration.

In addition, as a method for allowing the light irradiation conditions and effects between the fields of view to be uniform, adjustment in image processing, adjustment of the light output of the light source 8, adjustment of a probe current of the beam b1, adjustment of the number of frames when imaging, and the like may be applied. Furthermore, a method for adjusting other parameters that contribute to uniformity between the fields of view may be applied.

For example, the following is an example of a technique for realizing uniform feature amounts between the fields of view by adjusting the number of frames. The image processing unit 15 includes a storage medium such as a frame memory that stores the plurality of two-dimensional image data obtained based on two-dimensional scanning with the beam b1 on the target object multiple times. The detection signal d1 output from the detector 7 is stored in the storage medium such as a frame memory in synchronism with the scanning with the beam b1 by the polarizer 102 for the scanning. A computation device provided in the image processing unit 15 performs predetermined computation on the image signals (in other words, the plurality of frames) stored in this frame memory. This operation is integration and, for example, addition averaging. As a result of this calculation, an integrated image which is an image suitable for observation is generated. Due to a large number of frames during such integration, an image with a high signal/noise ratio can be generated.

For example, the image processing unit 15 selects the number of frames that is an integration target so that the integrated images of different fields of view have a uniform contrast. Specifically, the image processing unit 15 sets the number of frames for each field-of-view position and sets the number of frames as the operating condition of the charged particle beam apparatus so that a luminance ratio between the luminance of the edge portion of the pattern shape of the sample 4 and the luminance of the background portion other than the edge falls within a predetermined error range. Even with such a technique, uniform light irradiation conditions and effects between the fields of view can be realized.

[7-5. Effects and Others]

As described above, according to the charged particle beam apparatus 1 according to the seventh embodiment, the relationship between the irradiation position of the beam b1 and the irradiation position of the light a1 is controlled to a predetermined relationship, and the light irradiation conditions and effects between the plurality of fields of view are stabilized and allowed to be uniform. Then, in the case of observing the sample 4 by using the plurality of fields of view, and the like, the effect such as an improvement in total throughput can be obtained.

Eighth Embodiment

An eighth embodiment will be described with reference to FIGS. 24 and 25. A charged particle beam apparatus according to the eighth embodiment has a function as an SEM and has a function of performing, for example, defect inspection by using a secondary electron image obtained based on the irradiation with the beam b1 and the light a1 on the sample 4.

In the related art, as one method for inspecting defects, there is an inspection method for comparing an SEM image (referred to as an inspection image) obtained by imaging the sample that is a defect inspection target with a reference image acquired in advance. An inspection image is an image obtained by imaging the portion such as a pattern shape that is an inspection target portion. The inspection target portion is, for example, a portion determined to have the defect or foreign materials by a higher-level defect inspection device. A reference image is, for example, an image obtained by imaging the portion of a pattern shape of the sample having the pattern shape that is the same as the pattern shape of the inspection target portion of the target sample and has no defects. For example, the SEM extracts differences between the images as foreign materials or defects based on the comparison of these images.

On the other hand, when the image acquisition conditions are different between the inspection image and the reference image, even though there is no defect in the target sample, there is a possibility that the difference between the images caused by the difference in the image acquisition conditions may be erroneously recognized as defects. One of the image acquisition conditions is a light irradiation condition during the imaging.

Therefore, in the eighth embodiment, the following inspection method is proposed as an inspection method for extracting defects by comparing the inspection image with the reference image. In this inspection method, not only the condition that the portion having the pattern of the same shape as the inspection target portion is used as the reference image, but also the condition that the reference image having the same light irradiation conditions as the inspection image is acquired to be used as a comparison target is employed.

[8-1. Charged Particle Beam Apparatus]

FIG. 24 illustrates a configuration of a system including the SEM that is the charged particle beam apparatus 1 according to the eighth embodiment. The configuration of this charged particle beam apparatus 1 is the same as that illustrated in FIG. 1 and the like, and although the position adjustment marks 10 and the like in FIG. 1 are unnecessary, the position adjustment marks 10 and the like may be provided. Similarly to FIG. 20, this SEM also includes the polarizer 120 and the like that enable movement of the field of view. An inspection device 3 is connected to the upper level of the computer system 2 of this SEM via communication. The inspection device 3 is, for example, an optical inspection device. The inspection device 3 determines and detects the presence or absence of the defects and the foreign materials in the target sample during the defect inspection. The inspection device 3 transmits information 801 such as an inspection result to the computer system 2. Alternatively, the computer system 2 may access the inspection device 3 and refer to the information 801. The computer system 2 performs the defect inspection for confirming and extracting the defects and the like of the target sample with images based on the information 801. The user U1 performs such a defect inspection work.

[8-2. Defect Inspection Method]

FIG. 25 illustrates an explanatory diagram of a defect inspection method according to the eighth embodiment. FIG. 25 illustrates a positional relationship between an inspection image acquisition area 1601, a reference image acquisition area 1602, and a light irradiation area 1600 of the light a1 (laser light) on the X-Y plane. The inspection image acquisition area 1601 is a plurality of areas 1611 that are detected and acquired in order to generate the inspection image during the current inspection. The solid line area is acquired, but the dashed line area is not acquired. The reference image acquisition area 1602 is a plurality of areas 1612 that are acquired as reference images. The inspection image acquisition area 1601 and the reference image acquisition area 1602 refer to the plurality of areas corresponding to the plurality of selected fields of view within the range of dashed lines. Each area of the inspection image acquisition areas 1601 is indicated by numbers 1 to 25 for identification. Each area of the reference image acquisition areas 1602 is indicated by r1 to r25 for identification.

The computer system 2 which is a control device in the SEM in FIG. 25 or the computation device that generates an operation program (in other words, a recipe) of the SEM refers to the information 801 output from the upper-level inspection device 3. The computer system 2 sets the area 1611 including the defect and the like as the inspection image acquisition area based on coordinate information indicating the position of the defect and the like in the information 801. In this example, areas 1611 with numbers 2, 3, 10, 11, 12, 13, 20, 21, and 24 denote areas determined to have defects or the like. The computer system 2 generates a recipe of acquiring a plurality of images of the plurality of areas 1611. At the same time, the computer system 2 sets a light irradiation area 1621 (corresponding light irradiation position and the like) by the light a1 so as to include the plurality of areas 1611 such as defects. In this example, the light irradiation position which is the center of the light irradiation area 1621 is in the area of the number 13.

Furthermore, the computer system 2 acquires the area 1612 where the same pattern shapes as the pattern shapes at the positions of the plurality of areas 1611 set as the inspection image acquisition areas 1601 is formed as the reference image on the layout data of the semiconductor device that is the sample 4 of the inspection target. For this reason, the computer system 2 sets the recipe of acquiring the images of the plurality of areas 1612 indicated by the areas r2, r3, r10, r11, r12, r13, r20, r21, and r24. Together with this, the computer system 2 sets the light irradiation area 1622 in the reference image acquisition area 1602 so that the irradiation with the light a1 is performed under the same light irradiation conditions as the light irradiation area 1621 of the inspection image acquisition area 1601. For example, the area r13 is set as the irradiation position of the light a1.

In this example, as the reference image, a new reference image is formed by using a defect-free sample 4 that is different from the sample 4 of the inspection target. Alternatively, in the sample 4 of the inspection target, a new reference image is formed by using a defect-free area that is different from the area of the inspection target. The charged particle beam apparatus acquires the inspection image and the reference image by imaging by using the recipe set as described above, and compares these images to determine the presence or absence of defects, and the like in the area 1611 of the inspection image.

In such a comparison inspection, the plurality of images of the plurality of areas 1611 can be formed at a high speed by moving the field of view (corresponding area) by using the polarizer 120. Moreover, in this comparison inspection, since the light irradiation conditions such as a light intensity distribution can be prepared between the areas to be compared (for example, the area 1611 of the number 2 and the area 1612 of the area r2) in the inspection image and the reference image, highly accurate comparison inspection is enabled, and the differences between images due to differences in the image acquisition conditions can be prevented from being erroneously recognized as defects.

It is noted that the data about the reference image acquisition area once acquired is stored together with the information of the light irradiation conditions and the like, so that the data can be referred to and used in the subsequent inspection.

Appendix

As described above, the embodiments of the present disclosure are not limited to the above description, and various modifications can be made without departing from the scope of the disclosure. Components of the embodiments can be added, deleted, or replaced. In addition, an aspect can be realized by a combination of the embodiments. Each component may be singular or plural. The charged particle beam apparatus according to the embodiment can also be applied to a general-purpose SEM and the like.

REFERENCE SIGNS LIST

1: charged particle beam apparatus
2: computer system
4: sample
6: stage
7: detector
8: light source
9: light source adjustment stage
10: position adjustment mark
11: photodetector
12: vacuum chamber
13: light control unit
14: control unit
15: image processing unit
16: image display unit
17: drive control unit
18: storage unit
a1: light
b1: beam

The invention claimed is:

1. A charged particle beam apparatus comprising:
a charged particle source generating a charged particle beam with which a sample is irradiated;
a light source generating a light with which the sample is irradiated;
a first detector detecting secondary charged particles obtained by irradiating the sample with the charged particle beam;
a stage on which the sample is mounted;
a position adjustment mark provided on the stage and irradiated with the charged particle beam and the light;
a second detector detecting a secondary light obtained by irradiating the position adjustment mark with the light;
a computer system controlling irradiation with the charged particle beam and irradiation with the light, acquiring a first detection signal by the first detector and a second detection signal by the second detector, and generating and displaying an image; and
a mechanism setting an irradiation position of the charged particle beam and an irradiation position of the light with respect to the stage and changing a relative positional relationship including a distance between the irradiation position of the light and the stage, under control of the computer system,
wherein the computer system:
generates a first image in which the position adjustment mark is reflected based on the first detection signal obtained by irradiating the position adjustment mark with the charged particle beam;
generates a second image in which an irradiation area of the light is reflected in the vicinity of the position adjustment mark based on the second detection signal obtained by irradiating the position adjustment mark with the light; and
adjusts the irradiation position of the charged particle beam and the irradiation position of the light based on the first image and the second image obtained when the positional relationship is changed by the mechanism.

2. The charged particle beam apparatus according to claim 1,
wherein when two-dimensional directions associated with an upper surface of the stage are an X direction and a Y direction and a direction perpendicular to the X direction and the Y direction is a Z direction,
the mechanism changes the irradiation position of the light and the irradiation position of the charged particle beam with respect to an irradiation surface of the position adjustment mark on the stage in each of the X direction, the Y direction, and the Z direction, as a change of the positional relationship and changes an irradiation direction of the light with respect to the irradiation surface of the position adjustment mark on the stage.

3. The charged particle beam apparatus according to claim 1,
wherein the position adjustment mark has a plurality of portions having different heights, and
wherein the computer system:
extracts luminance and a change in luminance of the irradiation area of the light based on the second detection signal obtained by irradiating the position adjustment mark with the light when the positional relationship is changed and specifies the irradiation position of the light so that the luminance is lower than a threshold value; and
adjusts the irradiation position of the charged particle beam and the irradiation position of the light to match with each other.

4. The charged particle beam apparatus according to claim 1, wherein the position adjustment mark has an upper surface portion having a maximum height, a hole provided in a center, and a groove provided to extend in at least one direction with respect to the hole in a configuration viewed from an upper surface.

5. The charged particle beam apparatus according to claim 1, wherein the position adjustment mark has an upper surface portion made of a first material and a center portion made of a second material in a configuration viewed from an upper surface, and a critical frequency of the second material is higher than a critical frequency of the first material.

6. A charged particle beam apparatus comprising:
a charged particle source generating a charged particle beam with which a sample is irradiated;
a light source generating a light with which the sample is irradiated;
a first detector detecting secondary charged particles obtained by irradiating the sample with the charged particle beam;
a stage on which the sample is mounted;
a position adjustment sample mounted on the stage and irradiated with the charged particle beam and the light;
a second detector detecting a secondary light obtained by irradiating the position adjustment sample with the light;
a computer system controlling irradiation with the charged particle beam and irradiation with the light, acquiring a first detection signal by the first detector and a second detection signal by the second detector, and generating and displaying an image; and
a mechanism setting an irradiation position of the charged particle beam and an irradiation position of the light with respect to the stage and changing a relative positional relationship including a distance between the irradiation position of the light and the stage, under control of the computer system,
wherein the position adjustment sample has a structure where an insulating film as a first area and a conductive plug and an impurity diffusion layer under the insulating film as a second area are periodically arranged on a surface of a silicon wafer and, due to irradiation with a light having a wavelength that activates a junction formed with the silicon wafer and the impurity diffusion layer as the light, charging on the surface is removed or reduced to increase the number of secondary charged particles emitted, and
wherein the computer system:
generates an image in which an irradiation area of the light is reflected as an intensity distribution based on the first detection signal obtained by irradiating the position adjustment sample with both the charged particle beam and the light; and
adjusts the irradiation position of the charged particle beam and the irradiation position of the light based on the image obtained when the positional relationship is changed by the mechanism.

7. The charged particle beam apparatus according to claim 6, wherein the computer system:
measures the intensity distribution of the irradiation area of the light of the image, calculates a peak position of the intensity distribution, and calculates the distance between the irradiation position of the charged particle beam and the peak position of the intensity distribution of the irradiation area of the light; and
changes the positional relationship based on the distance by the mechanism to match the irradiation position of the charged particle beam with the peak position of the intensity distribution of the irradiation area of the light.

8. The charged particle beam apparatus according to claim 6,
wherein a position adjustment structure is provided on an upper surface of the stage,
wherein the position adjustment structure has a plurality of portions having different heights,
wherein a plurality of the position adjustment samples are installed in the plurality of portions as the position adjustment samples, and
wherein the computer system:
calculates a distance between the irradiation position of the charged particle beam and a peak position of the intensity distribution of the light for each height based on the first detection signal obtained by irradiating a plurality of the position adjustment samples of the plurality of portions with both the charged particle beam and the light and calculates a relationship between the height and the distance; and
changes the positional relationship by the mechanism according to a height of an irradiation surface on the stage and allows the irradiation position of the charged particle beam and the peak position of the intensity distribution of the irradiation area of the light to be matched with each other.

9. The charged particle beam apparatus according to claim 6,
wherein when two-dimensional directions associated with an upper surface of the stage are an X direction and a Y direction and a direction perpendicular to the X direction and the Y direction is a Z direction,
the mechanism changes the irradiation position of the light and the irradiation position of the charged particle beam with respect to an irradiation surface of the position adjustment mark on the stage in each of the X direction, the Y direction, and the Z direction, as a change of the positional relationship and changes an irradiation direction of the light with respect to the irradiation surface of the position adjustment mark on the stage.

10. A charged particle beam apparatus comprising:
a charged particle source generating a charged particle beam with which a sample is irradiated;
a light source generating a light with which the sample is irradiated;
a first detector detecting secondary charged particles obtained by irradiating the sample with the charged particle beam;
a stage on which the sample is mounted;
a position adjustment mark provided on the stage and irradiated with the charged particle beam and the light;
a position adjustment sample mounted on the stage and irradiated with the charged particle beam and the light;
a second detector detecting a secondary light obtained by irradiating the position adjustment mark or the position adjustment sample with the light;
a computer system controlling irradiation with the charged particle beam and irradiation with the light, acquiring a first detection signal by the first detector and a second detection signal by the second detector, and generating and displaying an image; and
a mechanism setting an irradiation position of the charged particle beam and an irradiation position of the light with respect to the stage and changing a relative positional relationship including a distance between the irradiation position of the light and the stage, under control of the computer system,
wherein the position adjustment sample has a structure where an insulating film as a first area and a conductive plug and an impurity diffusion layer under the insulating film as a second area are periodically arranged on a surface of a silicon wafer and, due to irradiation with a light having a wavelength that activates a junction formed with the silicon wafer and the impurity diffusion layer as the light, charging on the surface is removed or reduced to increase the number of secondary charged particles emitted, and wherein the computer system:

as first adjustment, generates a first image in which the position adjustment mark is reflected based on the first detection signal obtained by irradiating the position adjustment mark with the charged particle beam;

generates a second image in which an irradiation area of the light is reflected in the vicinity of the position adjustment mark based on the second detection signal obtained by irradiating the position adjustment mark with the light;

adjusts the irradiation position of the charged particle beam and the irradiation position of the light based on the first image and the second image obtained when the positional relationship is changed by the mechanism;

as second adjustment, generates an image in which an irradiation area of the light is reflected as an intensity distribution based on the first detection signal obtained by irradiating the position adjustment sample with both the charged particle beam and the light; and adjusts the irradiation position of the charged particle beam and the irradiation position of the light based on the image obtained when the positional relationship is changed by the mechanism.

11. The charged particle beam apparatus according to claim 10, wherein when two-dimensional directions associated with an upper surface of the stage are an X direction and a Y direction and a direction perpendicular to the X direction and the Y direction is a Z direction, the mechanism changes the irradiation position of the light and the irradiation position of the charged particle beam with respect to an irradiation surface of the position adjustment mark on the stage in each of the X direction, the Y direction, and the Z direction, as a change of the positional relationship and changes an irradiation direction of the light with respect to the irradiation surface of the position adjustment mark on the stage.

12. A charged particle beam apparatus comprising:

a charged particle source generating a charged particle beam with which a sample is irradiated;

a light source generating a light with which the sample is irradiated;

a detector detecting secondary charged particles obtained by irradiating the sample with the charged particle beam;

a stage on which the sample is mounted;

a position adjustment mark provided on the stage and irradiated with the charged particle beam and the light;

a computer system controlling irradiation with the charged particle beam and the irradiation with the light, acquiring a detection signal by the detector, and generating and displaying the image;

a mechanism setting an irradiation position of the charged particle beam and an irradiation position of the light with respect to the stage and changing a relative positional relationship including a distance between the irradiation position of the light and the stage, under control of the computer system, wherein the detector detects photoelectrons obtained by irradiating the position adjustment mark with the light, and wherein the computer system:

generates a first image in which the position adjustment mark is reflected based on the detection signal obtained by irradiating the position adjustment mark with the charged particle beam;

generates a second image in which an irradiation area of the light is reflected in the vicinity of the position adjustment mark based on the detection signal obtained by irradiating the position adjustment mark with the light; and adjusts the irradiation position of the charged particle beam and the irradiation position of the light based on the first image and the second image obtained when the positional relationship is changed by the mechanism.

13. The charged particle beam apparatus according to claim 12, wherein when two-dimensional directions associated with an upper surface of the stage are an X direction and a Y direction and a direction perpendicular to the X direction and the Y direction is a Z direction, the mechanism changes the irradiation position of the light and the irradiation position of the charged particle beam with respect to an irradiation surface of the position adjustment mark on the stage in each of the X direction, the Y direction, and the Z direction, as a change of the positional relationship and changes an irradiation direction of the light with respect to the irradiation surface of the position adjustment mark on the stage.

* * * * *